United States Patent
Saruki et al.

(10) Patent No.: US 8,659,289 B2
(45) Date of Patent: Feb. 25, 2014

(54) ROTATING FIELD SENSOR

(75) Inventors: Shunji Saruki, Tokyo (JP); Hiraku Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 432 days.

(21) Appl. No.: 13/166,409

(22) Filed: Jun. 22, 2011

(65) Prior Publication Data

US 2012/0038359 A1 Feb. 16, 2012

(30) Foreign Application Priority Data

Aug. 11, 2010 (JP) .................................. 2010-179935

(51) Int. Cl.
G01B 7/30 (2006.01)
G01B 7/14 (2006.01)
G01R 33/02 (2006.01)

(52) U.S. Cl.
USPC .................. 324/207.25; 324/207.23; 324/252

(58) Field of Classification Search
USPC ................................ 324/252, 166–167, 174, 324/207.11–207.23, 207.25–207.26; 73/514.31, 514.39, 520.01, 779, 73/862.193, 862.331–862.335; 702/57, 702/85, 94
See application file for complete search history.

(56) References Cited

U.S. PATENT DOCUMENTS

| | | | |
|---|---|---|---|
| 6,943,544 B2 | 9/2005 | Waffenschmidt | |
| 2010/0060272 A1* | 3/2010 | Tanaka et al. | 324/207.25 |
| 2011/0074406 A1* | 3/2011 | Mather et al. | 324/252 |
| 2012/0038351 A1* | 2/2012 | Saruki et al. | 324/207.25 |

FOREIGN PATENT DOCUMENTS

| JP | A-2003-65795 | 3/2003 |
|---|---|---|
| JP | A-2005-315696 | 11/2005 |
| JP | A-2009-186410 | 5/2009 |

* cited by examiner

*Primary Examiner* — Joshua Benitez-Rosario
*Assistant Examiner* — Giovanni Astacio-Oquendo
(74) *Attorney, Agent, or Firm* — Oliff PLC

(57) ABSTRACT

A field generation unit generates a rotating magnetic field including a first partial magnetic field in a first position and a second partial magnetic field in a second position. The first and second partial magnetic fields differ in direction by 180° and rotate in the same direction of rotation. A first detection unit detects, in the first position, a first angle that the direction of a first applied field forms with respect to a first direction. The first applied field includes the first partial magnetic field as its main component. A second detection unit detects, in the second position, a second angle that the direction of a second applied field forms with respect to a second direction. The second applied field includes the second partial magnetic field as its main component. A detected value of the angle that the direction of the rotating magnetic field in a reference position forms with respect to a reference direction is calculated based on detected values of the first and second angles.

17 Claims, 17 Drawing Sheets

ROTATING FIELD SENSOR

BACKGROUND OF THE INVENTION

1. Field of the Invention

The present invention relates to a rotating field sensor for detecting an angle that the direction of a rotating magnetic field forms with respect to a reference direction.

2. Description of the Related Art

In recent years, rotating field sensors have been widely used to detect the rotational position of an object in various applications such as detecting the rotational position of an automotive steering wheel. Rotating field sensors are used not only to detect the rotational position of an object but also to detect a linear displacement of an object. Systems using rotating field sensors are typically provided with means (for example, a magnet) for generating a rotating magnetic field whose direction rotates in conjunction with the rotation or linear movement of the object. The rotating field sensors use magnetic detection elements to detect the angle that the direction of the rotating magnetic field forms with respect to a reference direction. The rotational position or linear displacement of the object is thus detected.

There has been known a rotating field sensor that has two bridge circuits (Wheatstone bridge circuits) as shown in U.S. Pat. No. 6,943,544 B2. In this rotating field sensor, each of the two bridge circuits includes four magnetoresistive elements (hereinafter referred to as MR elements) serving as magnetic detection elements. Each of the bridge circuits detects the intensity of a component of the rotating magnetic field in one direction, and outputs a signal that indicates the intensity. The output signals of the two bridge circuits differ in phase by ¼ the period of the output signals of the bridge circuits. The angle that the direction of the rotating magnetic field forms with respect to a reference direction is calculated based on the output signals of the two bridge circuits.

Various types of rotating field sensors have heretofore been proposed that have a pair of magnetic detection elements for outputting a pair of detection signals having a phase difference of 180°. For example, JP-A-2009-186410 describes a rotation detecting apparatus including an encoder and a sensor unit. In the rotation detecting apparatus, the encoder has a portion to be detected that is arranged concentrically to the center of rotation of a rotating member. The magnetic property of the portion to be detected alternates in the circumferential direction. In the rotation detecting apparatus, the detecting part of the sensor unit includes a pair of magnetic detection elements of the same type. The magnetic detection elements are arranged so as to coincide in phase in the circumferential direction of the encoder and differ in phase by 180° in the direction of flow of magnetic flux.

JP-A-2009-186410 describes that the output signals of the pair of magnetic detection elements can be input to a differential line receiver to eliminate the effect of electrical noise that the transmission signals in the cable undergo from outside.

JP-A-2005-315696 describes a rotation angle detecting apparatus including a magnet that rotates with the rotation of a rotating body, and first and second groups of magnetic detection elements. In the rotation angle detecting apparatus, the magnet is formed in a cylindrical shape and is magnetized to two poles, or an N pole and an S pole, in parallel. The first and second groups of magnetic detection elements each include four Hall devices serving as the magnetic detection elements, which are arranged at intervals of 90° around the axis of rotation of the magnet. The four Hall devices H1 to H4 of the first group of magnetic detection elements and the four Hall devices H5 to H8 of the second group of magnetic detection elements are alternately arranged at intervals of 45°. The four Hall devices H1 to H4 of the first group of magnetic detection elements output signals of sinusoidal waveform with a phase difference of 90° from each other. Similarly, the four Hall devices H5 to H8 of the second group of magnetic detection elements output signals of sinusoidal waveform with a phase difference of 90° from each other.

The rotation angle detecting apparatus described in JP-A-2005-315696 generates difference data from the output signals of two Hall devices that lie at an interval of 180°, and detects the rotation angle of the rotating body based on the difference data. Specifically, the rotation angle detecting apparatus generates difference data H1-H2, H3-H4, H6-H5, and H8-H7 on respective four pairs of two Hall devices at an interval of 180°, i.e., H1 and H2, H3 and H4, H5 and H6, and H7 and H8. A rotation angle $\theta 1$ that is detected by the first group of magnetic detection elements is calculated from the difference data H1-H2 and the difference data H3-H4. A rotation angle $\theta 2$ that is detected by the second group of magnetic detection elements is calculated from the difference data H6-H5 and the difference data H8-H7.

JP-A-2005-315696 describes that the generation of the difference data from the output signals of two Hall devices at an interval of 180° can cancel the difference between the center of the magnet and the center of the Hall array of the eight Hall devices. JP-A-2005-315696 further describes that the rotation angle detected by the first group of magnetic detection elements and that detected by the second group of magnetic detection elements are compared to determine the presence or absence of the occurrence of an abnormal condition.

The magnetic detection elements of a rotating field sensor sometimes undergo not only the rotating magnetic field to detect but also a magnetic field other than the rotating magnetic field to detect. Such a magnetic field other than the rotating magnetic field will hereinafter be referred to as noise field. Examples of the noise field include a leakage magnetic field from a motor and the magnetism of the earth. When a noise field is thus applied to the magnetic detection elements, the magnetic detection elements detect a composite magnetic field resulting from a combination of the rotating magnetic field and the noise field. If the rotating magnetic field to detect and the noise field differ in direction, the angle detected by the rotating field sensor includes some error. For example, suppose that the rotating magnetic field to detect, in terms of magnetic flux density, has a magnitude of 20 mT, the noise field has a magnitude equivalent to the earth's magnetism, or 0.05 mT, and the direction of the noise field is orthogonal to that of the rotating magnetic field to detect. In such a case, the direction of the composite magnetic field is different from that of the rotating magnetic field to detect by 0.14°. As a result, the angle detected by the rotating field sensor includes an error of 0.14°. This shows that if, for example, an angle accuracy (resolution) of 0.1° is required of the angle to be detected by the rotating field sensor, even the earth's magnetism can be an extremely large noise source.

To reduce such an error resulting from the noise field in the angle detected by the rotating field sensor, a possible measure is to cover the magnetic detection elements and the magnet that generates the rotating magnetic field with a magnetic shield integrated with the rotating field sensor. If the source of the noise field is known, a magnetic shield can be provided between the source of the noise field and the magnetic detection elements. Such measures, however, have the drawbacks of making the design of the rotating field sensor including the magnetic shield large in scale, increasing the cost of the rotating field sensor, and placing various constraints on the assembly steps and on the installation of the rotating field sensor.

According to the rotation detecting apparatus described in JP-A-2009-186410, electrical noise produces errors of the same sign in the respective output signals of the pair of magnetic detection elements. Therefore, determining the difference between the output signals of the pair of magnetic detection elements can reduce the error in the detected angle resulting from the electrical noise. In the rotation detecting apparatus described in JP-A-2009-186410, however, a noise field produces errors of opposite sign in the respective output signals of the pair of magnetic detection elements. Determining the difference between the output signals of the pair of magnetic detection elements therefore cannot reduce the error in the detected angle resulting from the noise field.

According to the rotation angle detecting apparatus described in JP-A-2005-315696, the generation of difference data from the output signals of two Hall devices that lie at an interval of 180° can reduce the error in the detected angle resulting from the noise field. To obtain a detected angle, i.e., an angle θ1 or θ2, however, the rotation angle detecting apparatus needs at least four magnetic detection elements (Hall devices) that are arranged at intervals of 90° around the axis of rotation of the magnet. The rotation angle detecting apparatus described in JP-A-2005-315696 thus has a drawback that its application is limited to cases where the four magnetic detection elements can be arranged at intervals of 90°.

OBJECT AND SUMMARY OF THE INVENTION

It is an object of the present invention to provide a rotating field sensor that makes it possible to reduce the error in a detected angle resulting from a noise field and reduce the installation locations of magnetic detection elements.

A rotating field sensor of the present invention detects an angle that the direction of a rotating magnetic field in a reference position forms with respect to a reference direction. The rotating field sensor of the present invention includes a field generation unit that generates the rotating magnetic field. The rotating magnetic field generated by the field generation unit includes a first partial magnetic field in a first position and a second partial magnetic field in a second position. The first partial magnetic field and the second partial magnetic field differ in direction by 180° and rotate in the same direction of rotation. The rotating field sensor of the present invention further includes a first detection unit and a second detection unit. The first detection unit is provided for detecting, in the first position, a first angle that the direction of a first applied field forms with respect to a first direction. The first applied field includes the first partial magnetic field as its main component. The second detection unit is provided for detecting, in the second position, a second angle that the direction of a second applied field forms with respect to a second direction. The second applied field includes the second partial magnetic field as its main component.

The first detection unit has first and second detection circuits, and a first arithmetic circuit. Each of the first and second detection circuits includes at least one magnetic detection element, detects the intensity of a component of the first applied field in one direction and outputs a signal indicating the intensity. The first arithmetic circuit calculates a first detected angle value which is a detected value of the first angle, based on the output signals of the first and second detection circuits.

The second detection unit has third and fourth detection circuits, and a second arithmetic circuit. Each of the third and fourth detection circuits includes at least one magnetic detection element, detects the intensity of a component of the second applied field in one direction and outputs a signal indicating the intensity. The second arithmetic circuit calculates a second detected angle value which is a detected value of the second angle, based on the output signals of the third and fourth detection circuits.

The output signals of the first to fourth detection circuits have the same period. The output signal of the second detection circuit differs from the output signal of the first detection circuit in phase by an odd number of times ¼ the period. The output signal of the fourth detection circuit differs from the output signal of the third detection circuit in phase by an odd number of times ¼ the period.

The rotating field sensor of the present invention further includes a third arithmetic circuit that calculates, based on the first detected angle value and the second detected angle value, a detected value having a correspondence relationship with the angle that the direction of the rotating magnetic field in the reference position forms with respect to the reference direction.

According to the rotating field sensor of the present invention, the field generation unit generates a rotating magnetic field that includes the first partial magnetic field in the first position and the second partial magnetic field in the second position. The first partial magnetic field and the second partial magnetic field differ in direction by 180° and rotate in the same direction of rotation. According to the present invention, the first detection unit detects, in the first position, the first angle that the direction of the first applied field forms with respect to the first direction. The first applied field includes the first partial magnetic field as its main component. The second detection unit detects, in the second position, the second angle that the direction of the second applied field forms with respect to the second direction. The second applied field includes the second partial magnetic field as its main component. Based on the first detected angle value which is the detected value of the first angle and the second detected angle value which is the detected value of the second angle, the third arithmetic circuit calculates a detected value that has a correspondence relationship with the angle that the direction of the rotating magnetic field in the reference position forms with respect to the reference direction.

A noise field other than the rotating magnetic field may be applied to the rotating field sensor of the present invention from outside. In this case, the first applied field may be a composite magnetic field resulting from a combination of the first partial magnetic field and the noise field, and the second applied field may be a composite magnetic field resulting from a combination of the second partial magnetic field and the noise field. When a noise field other than the rotating magnetic field is applied to the rotating field sensor of the present invention from outside, the error in the first detected angle value resulting from the noise field and the error in the second detected angle value resulting from the noise field have values of opposite sign. Consequently, according to the present invention, it is possible to reduce the error in the detected angle resulting from the noise field.

In the rotating field sensor of the present invention, the first direction and the second direction may be different from each other by 180°.

In the rotating field sensor of the present invention, each of the first to fourth detection circuits may include, as the at least one magnetic detection element, a pair of magnetic detection elements connected in series. In this case, each of the first to fourth detection circuits may have a Wheatstone bridge circuit that includes a first pair of magnetic detection elements connected in series and a second pair of magnetic detection elements connected in series. The magnetic detection elements may be magnetoresistive elements. Each of the magnetoresistive elements may have a magnetization pinned layer whose direction of magnetization is pinned, a free layer whose direction of magnetization varies according to the direction of a magnetic field applied thereto, and a nonmagnetic layer disposed between the magnetization pinned layer and the free layer. The directions of magnetization of the magnetization pinned layers of the magnetoresistive elements in the second detection circuit may be orthogonal to those of the magnetization pinned layers of the magnetoresistive elements in the first detection circuit. The directions of magnetization of the magnetization pinned layers of the magnetoresistive elements in the fourth detection circuit may be orthogonal to those of the magnetization pinned layers of the magnetoresistive elements in the third detection circuit.

In the rotating field sensor of the present invention, the first detected angle value may include a first angular error with respect to a theoretical value of the first angle that is expected when the first applied field consists only of the first partial magnetic field and the direction of the first partial magnetic field makes an ideal rotation, while the second detected angle value may include a second angular error with respect to a theoretical value of the second angle that is expected when the second applied field consists only of the second partial magnetic field and the direction of the second partial magnetic field makes an ideal rotation. The first angular error and the second angular error may make periodic changes with the same error period in response to changes of the directions of the first and second partial magnetic fields. The change of the first angular error may depend on a change of the first detected angle value, and the change of the second angular error may depend on a change of the second detected angle value. The first detected angle value and the second detected angle value may differ in phase by an odd number of times ½ the error period. In this case, the first direction and the second direction may differ by an odd number of times ½ the error period in the direction of rotation of the first and second partial magnetic fields. The error period may be ¼ the period of the output signals of the detection circuits.

In the rotating field sensor of the present invention, the rotating magnetic field may further include a third partial magnetic field in a third position and a fourth partial magnetic field in a fourth position. The third partial magnetic field and the fourth partial magnetic field differ in direction by 180° and rotate in the same direction of rotation as the direction of rotation of the first and second partial magnetic fields. In this case, the rotating field sensor of the present invention may further include a third detection unit and a fourth detection unit. The third detection unit is provided for detecting, in the third position, a third angle that the direction of a third applied field forms with respect to a third direction. The third applied field includes the third partial magnetic field as its main component. The fourth detection unit is provided for detecting, in the fourth position, a fourth angle that the direction of a fourth applied field forms with respect to a fourth direction. The fourth applied field includes the fourth partial magnetic field as its main component.

The third detection unit has fifth and sixth detection circuits, and a fourth arithmetic circuit. Each of the fifth and sixth detection circuits includes at least one magnetic detection element, detects the intensity of a component of the third applied field in one direction and outputs a signal indicating the intensity. The fourth arithmetic circuit calculates a third detected angle value which is a detected value of the third angle, based on the output signals of the fifth and sixth detection circuits. The fourth detection unit has seventh and eighth detection circuits, and a fifth arithmetic circuit. Each of the seventh and eighth detection circuits includes at least one magnetic detection element, detects the intensity of a component of the fourth applied field in one direction and outputs a signal indicating the intensity. The fifth arithmetic circuit calculates a fourth detected angle value which is a detected value of the fourth angle, based on the output signals of the seventh and eighth detection circuits. The output signals of the first to eighth detection circuits have the same period. The output signal of the sixth detection circuit differs from the output signal of the fifth detection circuit in phase by an odd number of times ¼ the period. The output signal of the eighth detection circuit differs from the output signal of the seventh detection circuit in phase by an odd number of times ¼ the period.

The rotating field sensor of the present invention may further include a sixth arithmetic circuit and a seventh arithmetic circuit. The sixth arithmetic circuit calculates, based on the third detected angle value and the fourth detected angle value, a detected value having a correspondence relationship with the angle that the direction of the rotating magnetic field in the reference position forms with respect to the reference direction. The seventh arithmetic circuit calculates a detected value of the angle that the direction of the rotating magnetic field in the reference position forms with respect to the reference direction, based on the detected value calculated by the third arithmetic circuit and the detected value calculated by the sixth arithmetic circuit.

In the case where the rotating field sensor of the present invention includes the third and fourth detection units and the sixth and seventh arithmetic circuits mentioned above, a noise field other than the rotating magnetic field may be applied to the rotating field sensor from outside. In this case, the first applied field may be a composite magnetic field resulting from a combination of the first partial magnetic field and the noise field. The second applied field may be a composite magnetic field resulting from a combination of the second partial magnetic field and the noise field. The third applied field may be a composite magnetic field resulting from a combination of the third partial magnetic field and the noise field. The fourth applied field may be a composite magnetic field resulting from a combination of the fourth partial magnetic field and the noise field. Here, the first direction and the second direction may be different from each other by 180°. The third direction and the fourth direction may be different from each other by 180°.

In the case where the rotating field sensor of the present invention includes the third and fourth detection units and the sixth and seventh arithmetic circuits mentioned above, the first detected angle value may include a first angular error with respect to a theoretical value of the first angle that is expected when the first applied field consists only of the first partial magnetic field and the direction of the first partial magnetic field makes an ideal rotation. The second detected angle value may include a second angular error with respect to a theoretical value of the second angle that is expected when the second applied field consists only of the second partial magnetic field and the direction of the second partial magnetic field makes an ideal rotation. The third detected angle value may include a third angular error with respect to a theoretical value of the third angle that is expected when the third applied field consists only of the third partial magnetic field and the direction of the third partial magnetic field makes an ideal rotation. The fourth detected angle value may include a fourth angular error with respect to a theoretical value of the fourth angle that is expected when the fourth applied field consists only of the fourth partial magnetic field and the direction of the fourth partial magnetic field makes an ideal rotation.

The first to fourth angular errors may make periodic changes with the same error period in response to changes of the directions of the first to fourth partial magnetic fields. The changes of the first to fourth angular errors may depend on the changes of the directions of the first to fourth partial magnetic fields, respectively. In this case, the third position and the fourth position may be offset from the first position and the second position, respectively, by an amount equivalent to an odd number of times ½ the error period.

In the rotating field sensor of the present invention, when the first to fourth detected angle values include the aforementioned respective angular errors, the error period may be ½ the period of the rotation of the direction of the rotating magnetic field. The first angular error may include a component that changes with the error period depending on the change of the direction of the first partial magnetic field, and a component that changes with a second error period depending on a change of the first detected angle value. The second angular error may include a component that changes with the error period depending on the change of the direction of the second partial magnetic field, and a component that changes with the second error period depending on a change of the second detected angle value. The third angular error may include a component that changes with the error period depending on the change of the direction of the third partial magnetic field, and a component that changes with the second error period depending on a change of the third detected angle value. The fourth angular error may include a component that changes with the error period depending on the change of the direction of the fourth partial magnetic field, and a component that changes with the second error period depending on a change of the fourth detected angle value. In this case, the first detected angle value and the second detected angle value may differ in phase by an odd number of times ½ the second error period, while the third detected angle value and the fourth detected angle value may differ in phase by an odd number of times ½ the second error period.

According to the present invention, as described above, when a noise field is applied to the rotating field sensor from outside, the error occurring in the first detected angle value due to the noise field and the error occurring in the second detected angle value due to the noise field have values of opposite sign. Consequently, according to the present invention, it is possible to reduce the error in the detected angle resulting from the noise field. The foregoing effect of the present invention is provided by the arrangement of the first and second detection units in the first and second positions. The present invention thus makes it possible to reduce the error in the detected angle resulting from the noise field and also reduce the installation locations of the magnetic detection elements.

Other and further objects, features and advantages of the present invention will appear more fully from the following description.

DETAILED DESCRIPTION OF THE PREFERRED EMBODIMENTS

First Embodiment

Figure 1:
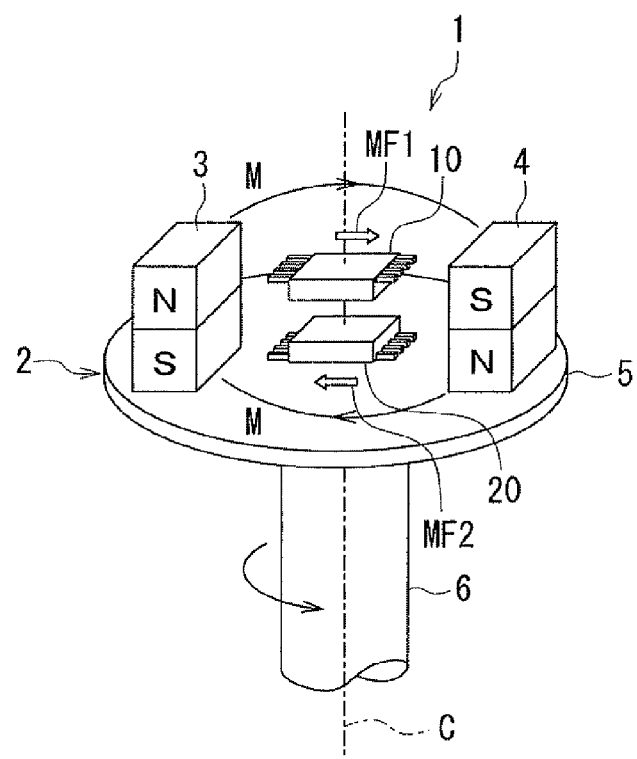
FIG. 1 is a perspective view showing the general configuration of a rotating field sensor according to a first embodiment of the invention.
Figure 2:
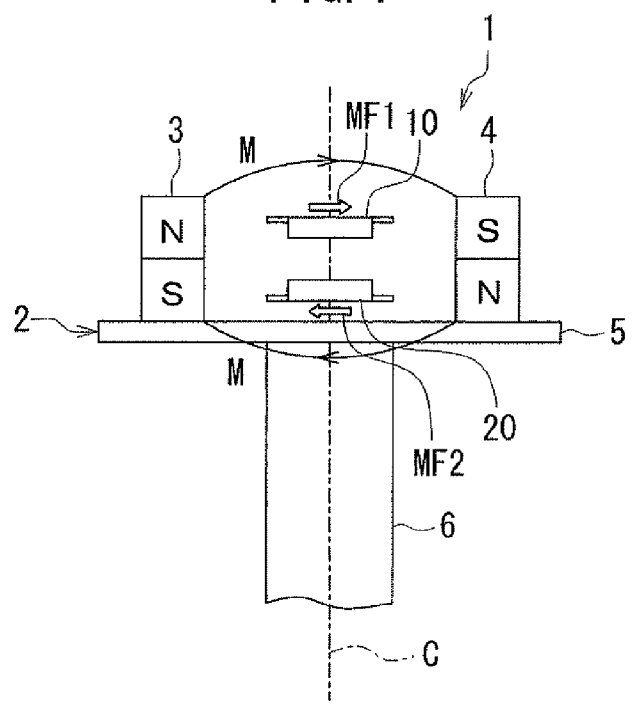
FIG. 2 is a side view showing the general configuration of the rotating field sensor according to the first embodiment of the invention.
Figure 4A:
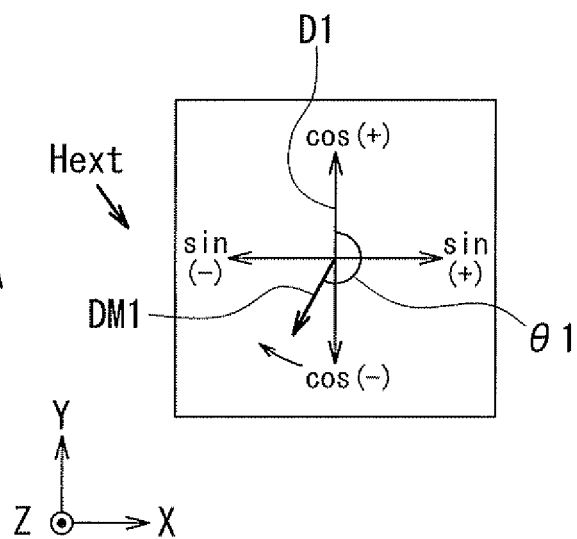
FIG. 4A is an explanatory diagram illustrating the definitions of directions and angles in the first embodiment of the invention.
Figure 4B:
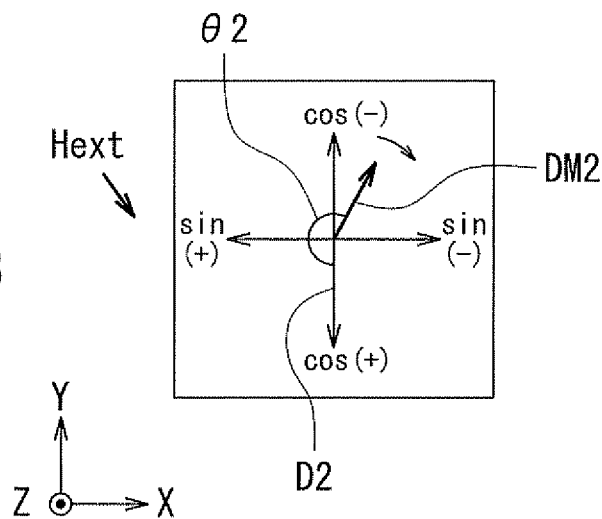
FIG. 4B is an explanatory diagram illustrating the definitions of directions and angles in the first embodiment of the invention.

Preferred embodiments of the present invention will now be described in detail with reference to the drawings. First, reference is made to FIG. 1, FIG. 2, FIG. 4A and FIG. 4B to describe the general configuration of a rotating field sensor according to a first embodiment of the invention. FIG. 1 is a perspective view showing the general configuration of the rotating field sensor according to the present embodiment. FIG. 2 is a side view showing the general configuration of the rotating field sensor according to the present embodiment. FIG. 4A and FIG. 4B are explanatory diagrams illustrating the definitions of directions and angles in the present embodiment.

The rotating field sensor 1 according to the present embodiment detects the angle that the direction of a rotating magnetic field in a reference position forms with respect to a reference direction. The rotating magnetic field includes a first partial magnetic field MF1 in a first position and a second partial magnetic field MF2 in a second position. The first partial magnetic field MF1 and the second partial magnetic field MF2 differ in direction by 180° and rotate in the same direction of rotation.

As shown in FIG. 1 and FIG. 2, the rotating field sensor 1 includes a field generation unit 2, a first detection unit 10, and a second detection unit 20. The field generation unit 2 generates the rotating magnetic field. The first detection unit 10 is provided for detecting, in the first position, a first angle that the direction of a first applied field forms with respect to a first direction. The first applied field includes the first partial magnetic field MF1 as its main component. The second detection unit 20 is provided for detecting, in the second position, a second angle that the direction of a second applied field forms with respect to a second direction. The second applied field includes the second partial magnetic field MF2 as its main component. For the sake of convenience, in FIG. 1 and FIG. 2, the first detection unit 10 is shown in a position separate from the arrow that represents the first partial magnetic field MF1, and the second detection unit 20 is shown in a position separate from the arrow that represents the second partial magnetic field MF2. In actuality, however, the first detection unit 10 is located in the first position where the first partial magnetic field MF1 occurs, and the second detection unit 20 is located in the second position where the second partial magnetic field MF2 occurs. The definitions of directions and angles will be described in detail later.

The field generation unit 2 includes a disc part 5, and a pair of magnets 3 and 4 attached to the disc part 5. The disc part 5 is attached to one axial end of a rotating shaft 6 which is the object whose rotational position is to be detected. The rotating shaft 6 rotates about its center axis. With the rotation, the field generation unit 2 also rotates about the center of rotation C including the center axis of the rotating shaft 6. The pair of magnets 3 and 4 are arranged in symmetrical positions with respect to a virtual plane that includes the center of rotation C. Here, for the disc part 5, the lower surface in FIG. 1 and FIG. 2 will be defined as a "bottom surface", and the upper surface in FIG. 1 and FIG. 2 will be defined as a "top surface." Both the top and bottom surfaces of the disc part 5 are perpendicular to the center of rotation C. The magnets 3 and 4 are fixed to the top surface of the disc part 5. The one end of the rotating shaft 6 is fixed to the bottom surface of the disc part 5. In the field generation unit 2, the magnets 3 and 4 are rotated about the center of rotation C, whereby a rotating magnetic field is generated based on the magnetic field generated by the magnets 3 and 4.

Each of the magnets 3 and 4 has an N pole and an S pole. The N and S poles of the magnet 3 are arranged in the order of the S pole and the N pole from the top surface of the disc part 5. The N and S poles of the magnet 4 are arranged in the order of the N pole and the S pole from the top surface of the disc part 5. The direction of the rotating magnetic field generated by the pair of magnets 3 and 4 rotates about the center of rotation C with the rotation of the field generation unit 2. In FIG. 1 and FIG. 2, the major portion of the magnetic flux from the N pole of the magnet 3 to the S pole of the magnet 4 and the major portion of the magnetic flux from the N pole of the magnet 4 to the S pole of the magnet 3 are shown by curves designated by symbol M. The magnetic flux from the N pole of the magnet 3 to the S pole of the magnet 4 produces most of the first partial magnetic field MF1 in the first position. The magnetic flux from the N pole of the magnet 4 to the S pole of the magnet 3 produces most of the second partial magnetic field MF2 in the second position.

The first and second detection units 10 and 20 are arranged above the top surface of the disc part 5, between the magnets 3 and 4. More specifically, in the present embodiment, the first detection unit 10 is located in the first position on the center of rotation C where the first partial magnetic field MF1 occurs, and the second detection unit 20 is located in the second position on the center of rotation C where the second partial magnetic field MF2 occurs. In FIG. 1 and FIG. 2, the first detection unit 10 and the second detection unit 20 are shown as separate members. However, the first detection unit 10 and the second detection unit 20 may be integrated with each other as long as they are located in the first position and the second position, respectively. In the present embodiment, the direction of the first partial magnetic field MF1 is from the N pole of the magnet 3 to the S pole of the magnet 4. The direction of the second partial magnetic field MF2 is from the N pole of the magnet 4 to the S pole of the magnet 3. The direction of the first partial magnetic field MF1 and that of the second partial magnetic field MF2 are different from each other by 180°. The rotation of the field generation unit 2 rotates the first partial magnetic field MF1 and the second partial magnetic field MF2 in the same direction of rotation.

With reference to FIG. 4A and FIG. 4B, the definitions of directions and angles in the present embodiment will be described. FIG. 4A illustrates the definitions of directions and angles in the first position. FIG. 4B illustrates the definitions of directions and angles in the second position. First, a direction that is parallel to the center of rotation C shown in FIG. 1 and FIG. 2 and is away from the top surface of the disc part 5 will be defined as the Z direction. Next, two mutually-orthogonal directions on a virtual plane perpendicular to the Z direction will be defined as the X direction and Y direction. In FIG. 4A and FIG. 4B, the X direction is shown as the direction toward the right, and the Y direction is shown as the upward direction. The direction opposite to the X direction will be defined as the −X direction, and the direction opposite to the Y direction will be defined as the −Y direction.

The first position is where the first detection unit 10 detects the first applied field. In the present embodiment, the first position is located on the center of rotation C, above the top surface of the disc part 5. The first direction D1 is a reference direction with respect to which the first detection unit 10 indicates the direction DM1 of the first applied field. In the present embodiment, the first direction D1 coincides with the Y direction. The first applied field includes the first partial magnetic field MF1 as its main component. The direction DM1 of the first applied field and the direction of the first partial magnetic field MF1 shall rotate clockwise in FIG. 4A. The first angle that the direction DM1 of the first applied field forms with respect to the first direction D1 will be denoted by symbol $\theta1$. The angle that the direction of the first partial magnetic field MF1 forms with respect to the first direction D1 will be denoted by symbol $\theta1m$ (not shown in FIG. 4A). If the first applied field consists only of the first partial magnetic field MF1, $\theta1$ is equal to $\theta1m$. The angles $\theta1$ and $\theta1m$ are expressed in positive values when viewed clockwise from the first direction D1, and in negative values when viewed counterclockwise from the first direction D1.

The second position is where the second detection unit 20 detects the second applied field. In the present embodiment, the second position is located on the center of rotation C, above the top surface of the disc part 5, and is located closer to the top surface of the disc part 5 than is the first position. The second direction D2 is a reference direction with respect to which the second detection unit 20 indicates the direction DM2 of the second applied field. In the present embodiment, the first direction D1 and the second direction D2 are different from each other by 180°. In the present embodiment, the second direction D2 coincides with the −Y direction. The second applied field includes the second partial magnetic field MF2 as its main component. The direction DM2 of the second applied field and the direction of the second partial magnetic field MF2 shall rotate clockwise in FIG. 4B. The second angle that the direction DM2 of the second applied field forms with respect to the second direction D2 will be denoted by symbol $\theta2$. The angle that the direction of the second partial magnetic field MF2 forms with respect to the second direction D2 will be denoted by symbol $\theta2m$ (not shown in FIG. 4B). If the second applied field consists only of the second partial magnetic field MF2, $\theta2$ is equal to $\theta2m$. The angles $\theta2$ and $\theta2m$ are expressed in positive values when viewed clockwise from the second direction D2, and in negative values when viewed counterclockwise from the second direction D2. In the present embodiment, the first direction D1 and the second direction D2 differ by 180°, and the first partial magnetic field MF1 and the second partial magnetic field MF2 also differ in direction by 180°. Therefore, the angles $\theta1m$ and $\theta2m$ are equal.

The reference position and the reference direction may coincide with the first position and the first direction D1, respectively, or with the second position and the second direction D2, respectively, or may be any position and direction different from those positions and directions.

Figure 3:
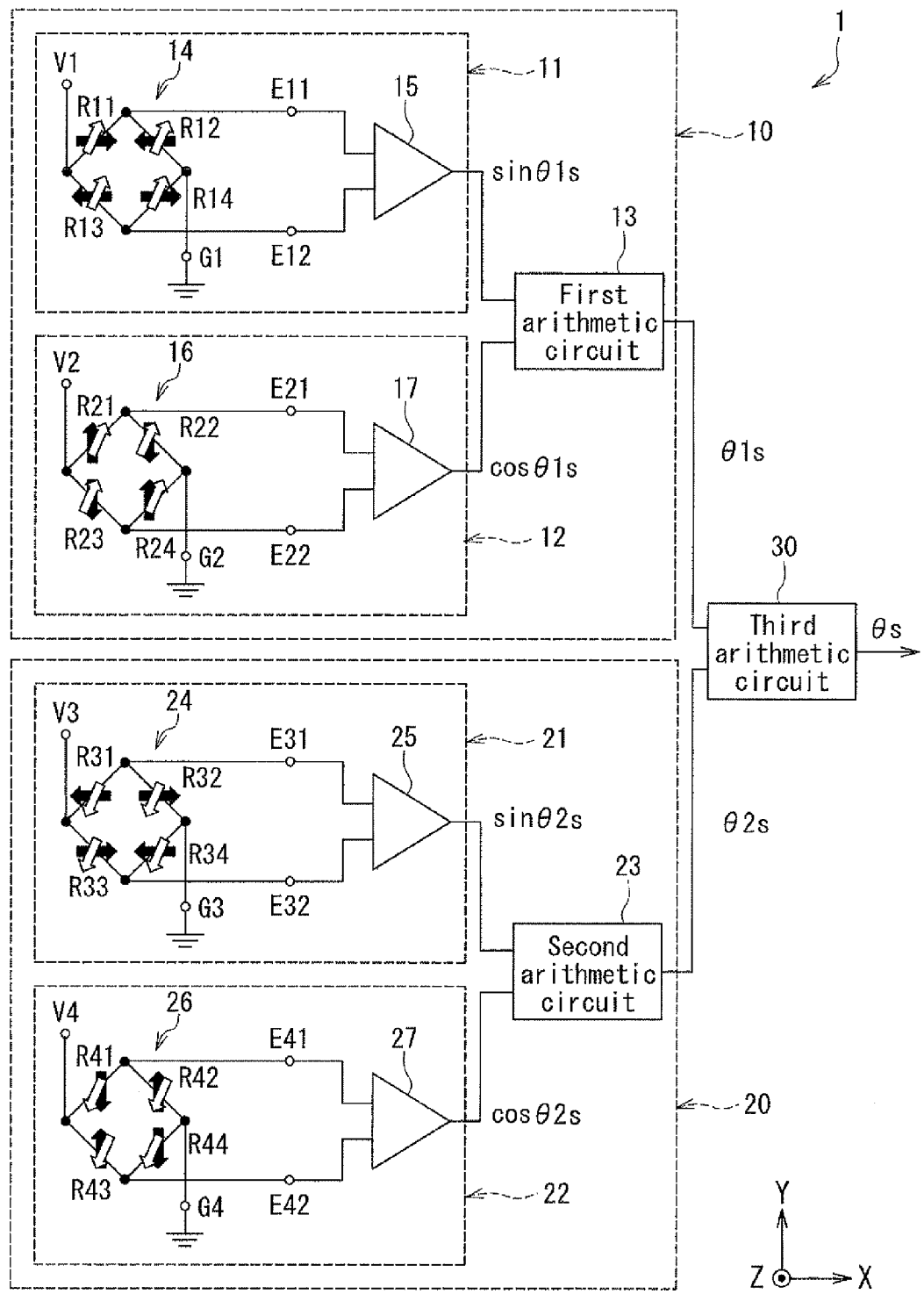
FIG. 3 is a circuit diagram showing the configuration of the rotating field sensor according to the first embodiment of the invention.

Next, the configuration of the rotating field sensor 1 will be described in detail with reference to FIG. 3. FIG. 3 is a circuit diagram showing the configuration of the rotating field sensor 1. As already mentioned, the rotating field sensor 1 includes the first detection unit 10 and the second detection unit 20. The first detection unit 10 has a first detection circuit 11, a second detection circuit 12, and a first arithmetic circuit 13. Each of the first and second detection circuits 11 and 12 detects the intensity of a component of the first applied field in one direction, and outputs a signal indicating the intensity. Based on the output signals of the first and second detection circuits 11 and 12, the first arithmetic circuit 13 calculates a first detected angle value $\theta1s$, which is a detected value of the first angle $\theta1$.

The second detection unit 20 has basically the same configuration as that of the first detection unit 10. Specifically, the second detection unit 20 has a third detection circuit 21, a fourth detection circuit 22, and a second arithmetic circuit 23. Each of the third and fourth detection circuits 21 and 22 detects the intensity of a component of the second applied field in one direction, and outputs a signal indicating the intensity. Based on the output signals of the third and fourth detection circuits 21 and 22, the second arithmetic circuit 23 calculates a second detected angle value $\theta2s$, which is a detected value of the second angle $\theta2$.

The output signals of the first to fourth detection circuits 11, 12, 21, and 22 have the same period. In the following description, the period of the output signals of the first to fourth detection circuits 11, 12, 21, and 22 will be referred to as period T. The output signal of the second detection circuit 12 differs from the output signal of the first detection circuit 11 in phase by an odd number of times ¼ the period T. The output signal of the fourth detection circuit 22 differs from the output signal of the third detection circuit 21 in phase by an odd number of times ¼ the period T.

In the present embodiment, the first partial magnetic field MF1 and the second partial magnetic field MF2 differ in direction by 180°, and the first direction D1 and the second direction D2 also differ by 180°. Therefore, the first detected angle value $\theta1s$ and the second detected angle value $\theta2s$ are the same in phase.

The rotating field sensor 1 further includes a third arithmetic circuit 30 that calculates a detected value $\theta s$ based on the first detected angle value $\theta1s$ obtained by the first detection unit 10 and the second detected angle value $\theta2s$ obtained by the second detection unit 20. The detected value $\theta s$ has a correspondence relationship with the angle that the direction of the rotating magnetic field in the reference position forms with respect to the reference direction. In the present embodiment, the third arithmetic circuit 30 calculates $\theta s$ by the equation (1) below.

$$\theta s=(\theta 1s+\theta 2s)/2 \qquad (1)$$

Each of the first to fourth detection circuits 11, 12, 21, and 22 includes at least one magnetic detection element. Each of the first to fourth detection circuits 11, 12, 21, and 22 may include, as the at least one magnetic detection element, a pair of magnetic detection elements connected in series. In this case, each of the first to fourth detection circuits 11, 12, 21, and 22 may have a Wheatstone bridge circuit that includes a first pair of magnetic detection elements connected in series and a second pair of magnetic detection elements connected in series. The following description will deal with the case where each of the first to fourth detection circuits 11, 12, 21, and 22 has such a Wheatstone bridge circuit.

The first detection circuit 11 has a Wheatstone bridge circuit 14 and a difference detector 15. The Wheatstone bridge circuit 14 includes a power supply port V1, a ground port G1, two output ports E11 and E12, a first pair of magnetic detection elements R11 and R12 connected in series, and a second pair of magnetic detection elements R13 and R14 connected in series. One end of each of the magnetic detection elements R11 and R13 is connected to the power supply port V1. The other end of the magnetic detection element R11 is connected to one end of the magnetic detection element R12 and the output port E11. The other end of the magnetic detection element R13 is connected to one end of the magnetic detection element R14 and the output port E12. The other end of each of the magnetic detection elements R12 and R14 is connected to the ground port G1. A power supply voltage of predetermined magnitude is applied to the power supply port V1. The ground port G1 is grounded. The difference detector 15 outputs to the first arithmetic circuit 13 a signal that corresponds to the potential difference between the output ports E11 and E12.

The second detection circuit 12 has a Wheatstone bridge circuit 16 and a difference detector 17. The Wheatstone bridge circuit 16 includes a power supply port V2, a ground port G2, two output ports E21 and E22, a first pair of magnetic detection elements R21 and R22 connected in series, and a second pair of magnetic detection elements R23 and R24 connected in series. One end of each of the magnetic detection elements R21 and R23 is connected to the power supply port V2. The other end of the magnetic detection element R21 is connected to one end of the magnetic detection element R22 and the output port E21. The other end of the magnetic detection element R23 is connected to one end of the magnetic detection element R24 and the output port E22. The other end of each of the magnetic detection elements R22 and R24 is connected to the ground port G2. A power supply voltage of predetermined magnitude is applied to the power supply port V2. The ground port G2 is grounded. The difference detector 17 outputs to the first arithmetic circuit 13 a signal that corresponds to the potential difference between the output ports E21 and E22.

The third detection circuit 21 has a Wheatstone bridge circuit 24 and a difference detector 25. The Wheatstone bridge circuit 24 includes a power supply port V3, a ground port G3, two output ports E31 and E32, a first pair of magnetic detection elements R31 and R32 connected in series, and a second pair of magnetic detection elements R33 and R34 connected in series. One end of each of the magnetic detection elements R31 and R33 is connected to the power supply port V3. The other end of the magnetic detection element R31 is connected to one end of the magnetic detection element R32 and the output port E31. The other end of the magnetic detection element R33 is connected to one end of the magnetic detection element R34 and the output port E32. The other end of each of the magnetic detection elements R32 and R34 is connected to the ground port G3. A power supply voltage of predetermined magnitude is applied to the power supply port V3. The ground port G3 is grounded. The difference detector 25 outputs to the second arithmetic circuit 23 a signal that corresponds to the potential difference between the output ports E31 and E32.

The fourth detection circuit 22 has a Wheatstone bridge circuit 26 and a difference detector 27. The Wheatstone bridge circuit 26 includes a power supply port V4, a ground port G4, two output ports E41 and E42, a first pair of magnetic detection elements R41 and R42 connected in series, and a second pair of magnetic detection elements R43 and R44 connected in series. One end of each of the magnetic detection elements R41 and R43 is connected to the power supply port V4. The other end of the magnetic detection element R41 is connected to one end of the magnetic detection element R42 and the output port E41. The other end of the magnetic detection element R43 is connected to one end of the magnetic detection element R44 and the output port E42. The other end of each of the magnetic detection elements R42 and R44 is connected to the ground port G4. A power supply voltage of predetermined magnitude is applied to the power supply port V4. The ground port G4 is grounded. The difference detector 27 outputs to the second arithmetic circuit 23 a signal that corresponds to the potential difference between the output ports E41 and E42.

In the present embodiment, all the magnetic detection elements included in the Wheatstone bridge circuits (hereinafter, referred to as bridge circuits) 14, 16, 24, and 26 are MR elements, or TMR elements in particular. GMR elements may be employed instead of the TMR elements. The TMR elements or GMR elements each have a magnetization pinned layer whose direction of magnetization is pinned, a free layer whose direction of magnetization varies according to the direction of a magnetic field applied thereto, and a nonmagnetic layer disposed between the magnetization pinned layer and the free layer. For TMR elements, the nonmagnetic layer is a tunnel barrier layer. For GMR elements, the nonmagnetic layer is a nonmagnetic conductive layer. The TMR elements or GMR elements vary in resistance depending on the angle that the direction of magnetization of the free layer forms with respect to the direction of magnetization of the magnetization pinned layer. The resistance reaches its minimum value when the foregoing angle is 0°. The resistance reaches its maximum value when the foregoing angle is 180°. In the following description, the magnetic detection elements included in the bridge circuits 14, 16, 24, and 26 will be referred to as MR elements. In FIG. 3, the filled arrows indicate the directions of magnetization of the magnetization pinned layers in the MR elements. The hollow arrows indicate the directions of magnetization of the free layers in the MR elements.

In the first detection circuit 11, the magnetization pinned layers of the MR elements R11 and R14 are magnetized in the X direction, and the magnetization pinned layers of the MR elements R12 and R13 are magnetized in the −X direction. In this case, the potential difference between the output ports E11 and E12 varies according to the intensity of the component of the first applied field in the X direction. The first detection circuit 11 therefore detects the intensity of the component of the first applied field in the X direction, and outputs a signal that indicates the intensity. When the first angle θ1 shown in FIG. 4A is 0° and 180°, the intensity of the component of the first applied field in the X direction is equal to 0. When the first angle θ1 is greater than 0° and smaller than 180°, the intensity of the component of the first applied field in the X direction takes on a positive value. When the first angle θ1 is greater than 180° and smaller than 360°, the intensity of the component of the first applied field in the X direction takes on a negative value.

In the second detection circuit 12, the magnetization pinned layers of the MR elements R21 and R24 are magnetized in the Y direction, and the magnetization pinned layers of the MR elements R22 and R23 are magnetized in the −Y direction. In this case, the potential difference between the output ports E21 and E22 varies according to the intensity of the component of the first applied field in the Y direction. The second detection circuit 12 therefore detects the intensity of the component of the first applied field in the Y direction, and outputs a signal that indicates the intensity. When the first angle θ1 shown in FIG. 4A is 90° and 270°, the intensity of the component of the first applied field in the Y direction is equal to 0. When the first angle θ1 is equal to or greater than 0° and smaller than 90°, and when the first angle θ1 is greater than 270° and smaller than or equal to 360°, the intensity of the component of the first applied field in the Y direction takes on a positive value. When the first angle θ1 is greater than 90° and smaller than 270°, the intensity of the component of the first applied field in the Y direction takes on a negative value.

In the example shown in FIG. 3, the directions of magnetization of the magnetization pinned layers of the MR elements in the second detection circuit 12 are orthogonal to those of the magnetization pinned layers of the MR elements in the first detection circuit 11. In an ideal situation, the output signal of the first detection circuit 11 has a sine waveform, and the output signal of the second detection circuit 12 has a cosine waveform. In this case, the output signal of the second detection circuit 12 differs from the output signal of the first detection circuit 11 in phase by ¼ the period T. Here, letting sin θ1s be the output signal of the first detection circuit 11 and cos θ1s be the output signal of the second detection circuit 12, the first detected angle value θ1s can be calculated by the equation (2) below. Note that "a tan" represents an arc tangent.

$$\theta 1s = a\tan(\sin\theta 1s/\cos\theta 1s) \quad (2)$$

Within the range of 360°, θ1s in the equation (2) has two solutions with a difference of 180° in value. Which of the two solutions of θ1s in the equation (2) is the true solution to θ1s can be determined from the combination of positive and negative signs on sin θ1s and cos θ1s. More specifically, if sin θ1s is positive in value, θ1s is greater than 0° and smaller than 180°. If sin θ1s is negative in value, θ1s is greater than 180° and smaller than 360°. If cos θ1s is positive in value, θ1s is equal to or greater than 0° and smaller than 90°, or is greater than 270° and smaller than or equal to 360°. If cos θ1s is negative in value, θ1s is greater than 90° and smaller than 270°. The first arithmetic circuit 13 determines θ1s within the range of 360°, using the equation (2) and based on the foregoing determination of the combination of positive and negative signs on sin θ1s and cos θ1s. Note that it is possible to determine θ1s not only when the output signal of the second detection circuit 12 is different from the output signal of the first detection circuit 11 in phase by ¼ the period T but also when the output signal of the second detection circuit 12 is different from the output signal of the first detection circuit 11 in phase by an odd number of times ¼ the period T.

In the third detection circuit 21, the magnetization pinned layers of the MR elements R31 and R34 are magnetized in the −X direction, and the magnetization pinned layers of the MR elements R32 and R33 are magnetized in the X direction. In this case, the potential difference between the output ports E31 and E32 varies according to the intensity of the component of the second applied field in the −X direction. The third detection circuit 21 therefore detects the intensity of the component of the second applied field in the −X direction, and outputs a signal that indicates the intensity. When the second angle θ2 shown in FIG. 4B is 0° and 180°, the intensity of the component of the second applied field in the −X direction is equal to 0. When the second angle θ2 is greater than 0° and smaller than 180°, the intensity of the component of the second applied field in the −X direction takes on a positive value. When the second angle θ2 is greater than 180° and smaller than 360°, the intensity of the component of the second applied field in the −X direction takes on a negative value.

In the fourth detection circuit 22, the magnetization pinned layers of the MR elements R41 and R44 are magnetized in the −Y direction, and the magnetization pinned layers of the MR elements R42 and R43 are magnetized in the Y direction. In this case, the potential difference between the output ports E41 and E42 varies according to the intensity of the component of the second applied field in the −Y direction. The fourth detection circuit 22 therefore detects the intensity of the component of the second applied field in the −Y direction, and outputs a signal that indicates the intensity. When the second angle θ2 shown in FIG. 4B is 90° and 270°, the intensity of the component of the second applied field in the −Y direction is equal to 0. When the second angle θ2 is equal to or greater than 0° and smaller than 90°, and when the second angle θ2 is greater than 270° and smaller than or equal to 360°, the intensity of the component of the second applied field in the −Y direction takes on a positive value. When the second angle θ2 is greater than 90° and smaller than 270°, the intensity of the component of the second applied field in the −Y direction takes on a negative value.

In the example shown in FIG. 3, the directions of magnetization of the magnetization pinned layers of the MR elements in the fourth detection circuit 22 are orthogonal to those of the magnetization pinned layers of the MR elements in the third detection circuit 21. In an ideal situation, the output signal of the third detection circuit 21 has a sine waveform, and the output signal of the fourth detection circuit 22 has a cosine waveform. In this case, the output signal of the fourth detection circuit 22 differs from the output signal of the third detection circuit 21 in phase by ¼ the period T. Here, letting sin θ2s be the output signal of the third detection circuit 21 and cos θ2s be the output signal of the fourth detection circuit 22, the second detected angle value θ2s can be calculated by the equation (3) below.

$$\theta 2s = a\tan(\sin\theta 2s/\cos\theta 2s) \quad (3)$$

In the same manner as the determination of θ1s described above, the second arithmetic circuit 23 determines θ2s within the range of 360° using the equation (3) and based on the determination of the combination of positive and negative signs on sin θ2s and cos θ2s. Note that it is possible to determine θ2s not only when the output signal of the fourth detection circuit 22 is different from the output signal of the third detection circuit 21 in phase by ¼ the period T but also when the output signal of the fourth detection circuit 22 is different from the output signal of the third detection circuit 21 in phase by an odd number of times ¼ the period T.

The first to third arithmetic circuits 13, 23, and 30 can be implemented by a single microcomputer, for example.

Figure 6:
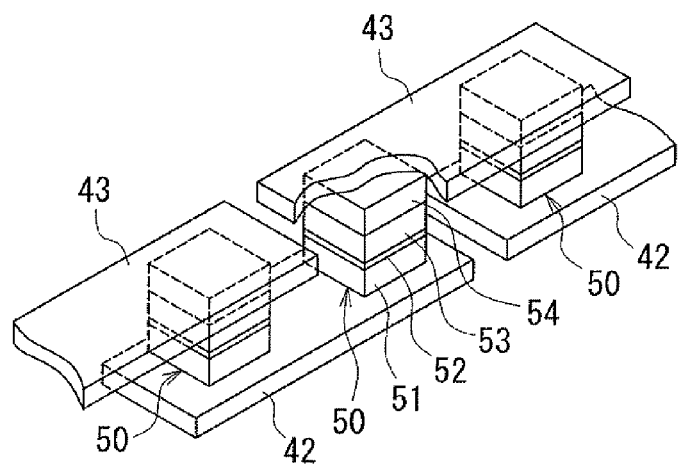
FIG. 6 is a perspective view showing part of an MR element in the rotating field sensor shown in FIG. 3.

An example of the configuration of the MR elements will now be described with reference to FIG. 6. FIG. 6 is a perspective view showing a part of an MR element in the rotating field sensor 1 shown in FIG. 3. In this example, the MR element has a plurality of lower electrodes, a plurality of MR films, and a plurality of upper electrodes. The plurality of lower electrodes 42 are arranged on a not-shown substrate. Each of the lower electrodes 42 has a long slender shape. Two lower electrodes 42 adjoining in the longitudinal direction of the lower electrodes 42 have a gap therebetween. As shown in FIG. 6, MR films 50 are provided on the top surfaces of the lower electrodes 42, near opposite ends in the longitudinal direction. Each of the MR films 50 includes a free layer 51, a nonmagnetic layer 52, a magnetization pinned layer 53, and an antiferromagnetic layer 54 that are stacked in this order, the free layer 51 being closest to the lower electrode 42. The free layer 51 is electrically connected to the lower electrode 42. The antiferromagnetic layer 54 is made of an antiferromagnetic material. The antiferromagnetic layer 54 is in exchange coupling with the magnetization pinned layer 53 so as to pin the direction of magnetization of the magnetization pinned layer 53. The plurality of upper electrodes 43 are arranged over the plurality of MR films 50. Each of the upper electrodes 43 has a long slender shape, and establishes electrical connection between the respective antiferromagnetic layers 54 of two adjoining MR films 50 that are arranged on two lower electrodes 42 adjoining in the longitudinal direction of the lower electrodes 42. With such a configuration, the plurality of MR films 50 in the MR element shown in FIG. 6 are connected in series by the plurality of lower electrodes 42 and the plurality of upper electrodes 43. It should be appreciated that the layers 51 to 54 of the MR films 50 may be stacked in an order reverse to that shown in FIG. 6.

The operation and effects of the rotating field sensor 1 will now be described with reference to FIG. 3, FIG. 4A, FIG. 4B, and FIG. 5. In the rotating field sensor 1, the first detection unit 10 determines the first detected angle value θ1s, which is the detected value of the first angle θ1, based on the output signals of the first and second detection circuits 11 and 12. The second detection unit 20 determines the second detected angle value θ2s, which is the detected value of the second angle θ2, based on the output signals of the third and fourth detection circuits 21 and 22. Based on the first detected angle value θ1s and the second detected angle value θ2s, the third arithmetic circuit 30 calculates the detected value θs having a correspondence relationship with the angle that the direction of the rotating magnetic field in the reference position forms with respect to the reference direction.

According to the present embodiment, even if a noise field other than the rotating magnetic field is applied to the rotating field sensor 1 from outside, it is possible to reduce the error in the detected value θs resulting from the noise field. This will be discussed in detail below. In the following description, the noise field will be denoted as noise field $H_{ext}$. The arrow indicated with symbol $H_{ext}$ in FIG. 4A and FIG. 4B shows an example of the noise field $H_{ext}$.

Figure 5:
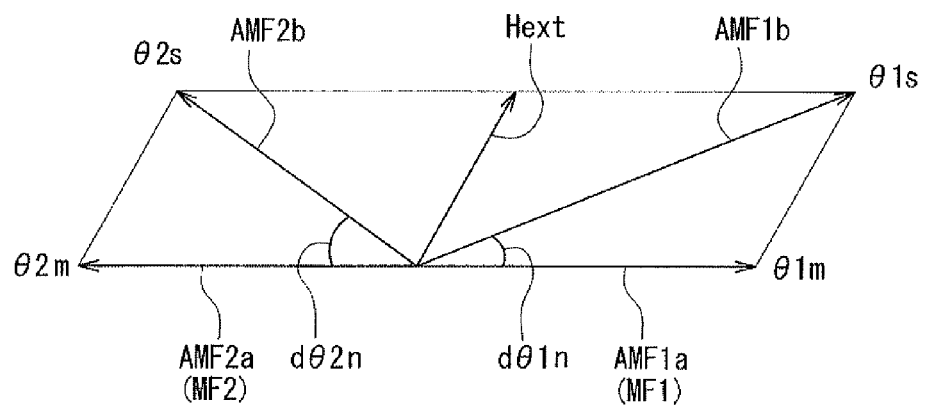
FIG. 5 is an explanatory diagram schematically illustrating the relationship between first and second applied field and a noise field in the first embodiment of the invention.

First, with reference to FIG. 5, a description will be given of the relationship between the first and second applied fields and the noise field $H_{ext}$. FIG. 5 is an explanatory diagram schematically illustrating the relationship between the first and second applied fields and the noise field $H_{ext}$. In the absence of the noise field $H_{ext}$, the first applied field consists only of the first partial magnetic field MF1, and the second applied field consists only of the second partial magnetic field MF2. In FIG. 5, the arrow denoted with symbol AMF1a indicates the first applied field in this instance, and the arrow denoted with symbol AMF2a indicates the second applied field in this instance. As shown in FIG. 5, the first applied field AMF1a and the second applied field AMF2a differ in direction by 180°, as with the first partial magnetic field MF1 and the second partial magnetic field MF2.

In the presence of the noise field $H_{ext}$, the first applied field is a composite magnetic field resulting from a combination of the first partial magnetic field MF1 and the noise field $H_{ext}$, and the second applied field is a composite magnetic field resulting from a combination of the second partial magnetic field MF2 and the noise field $H_{ext}$. In FIG. 5, the arrow denoted with symbol AMF1b shows the first applied field in this instance, and the arrow denoted with symbol AMF2b indicates the second applied field in this instance.

Next, the relationship between the first and second detected angle values θ1s and θ2s and the noise field $H_{ext}$ will be described. In the absence of the noise field $H_{ext}$, the first detected angle value θ1s is equal to the value of the angle θ1m that the direction of the first applied field AMF1a, i.e., the direction of the first partial magnetic field MF1, forms with respect to the first direction D1. In the presence of the noise field $H_{ext}$, the first detected angle value θ1s is equal to the value of the angle that the first applied field AMF1b, i.e., a composite magnetic field resulting from the combination of the first partial magnetic field MF1 and the noise field $H_{ext}$, forms with respect to the first direction D1. The difference between the angle formed by this composite magnetic field with respect to the first direction D1 and the angle θ1m is caused by the noise field $H_{ext}$ and responsible for the error in the detected angle value θ1s. In the present embodiment, this error will be referred to as the first noise error and denoted by symbol dθ1n. FIG. 5 also shows dθ1n.

Likewise, in the absence of the noise field $H_{ext}$, the second detected angle value θ2s is equal to the value of the angle θ2m that the direction of the second applied field AMF2a, i.e., the direction of the second partial magnetic field MF2, forms with respect to the second direction D2. In the presence of the noise field $H_{ext}$, the second detected angle value θ2s is equal to the value of the angle that the second applied field AMF2b, i.e., a composite magnetic field resulting from the combination of the second partial magnetic field MF2 and the noise field $H_{ext}$, forms with respect to the second direction D2. The difference between the angle formed by this composite magnetic field with respect to the second direction D2 and the angle θ2m is caused by the noise field $H_{ext}$ and responsible for the error in the detected angle value θ2s. In the present embodiment, this error will be referred to as the second noise error and denoted by symbol dθ2n. FIG. 5 also shows dθ2n.

The first noise error dθ1n is expressed in a positive value when viewed clockwise from the first partial magnetic field MF1, and in a negative value when viewed counterclockwise from the first partial magnetic field MF1. On the other hand, like the first noise error dθ1n, the second noise error dθ2n is expressed in a positive value when viewed clockwise from the second partial magnetic field MF2, and in a negative value when viewed counterclockwise from the second partial magnetic field MF2.

In the example shown in FIG. 5, the direction of the first applied field AMF1b is different from the direction of the first partial magnetic field MF1 by the absolute value |dθ1n| of the first noise error dθ1n in the counterclockwise direction in FIG. 5. On the other hand, the direction of the second applied field AMF2b is different from the direction of the second partial magnetic field MF2 by the absolute value |dθ2n| of the second noise error dθ2n in the clockwise direction in FIG. 5. In this case, the first detected angle value θ1s and the second detected angle value θ2s are expressed by the following equations (4) and (5), respectively.

$$θ1s=θ1m-|dθ1n| \quad (4)$$

$$θ2s=θ2m+|dθ2n| \quad (5)$$

The relationship between the detected value θs and the noise field $H_{ext}$ will now be described. As previously mentioned, the third arithmetic circuit 30 calculates the detected value θs based on the first detected angle value θ1s and the second detected angle value θ2s, using the equation (1). Substituting the equations (4) and (5) into the equation (1) gives the following equation (6).

$$\begin{aligned} θs &= (θ1s + θ2s)/2 \\ &= (θ1m - |dθ1n| + θ2m + |dθ2n|)/2 \\ &= (θ1m + θ2m)/2 + (-|dθ1n| + |dθ2n|)/2 \end{aligned} \quad (6)$$

As already mentioned, the angle θ1m and the angle θ2m are equal. Here, the angle that the direction of the rotating magnetic field in the reference position forms with respect to the reference direction, to be detected by the rotating field sensor 1, will be referred to as angle θ. Assuming that the angle θ is equal to the angle θ1m, the detected value θs is ideally equal to the angle θ in the absence of the noise field $H_{ext}$. However, as can be seen from the equation (6), the detected value θs contains an error having a correspondence relationship with both the first noise error dθ1n and the second noise error dθ2n. This error results from the noise field $H_{ext}$.

Now, a description will be made as to why the present embodiment allows reducing the error in the detected value θs resulting from the noise field $H_{ext}$. In the example shown in FIG. 5, the first noise error dθ1n takes on a negative value ($-|dθ1n|$), while the second noise error dθ2n takes on a positive value ($|dθ2n|$). Accordingly, when the detected value θs is calculated using the equation (6), the value of the first noise error dθ1n and the value of the second noise error dθ2n are canceled out to make the absolute value of the error in the detected value θs smaller than both the absolute value of the first noise error dθ1n and the absolute value of the second noise error dθ2n.

Suppose that the direction of the noise field $H_{ext}$ is opposite to that in the example shown in FIG. 5. In this case, the direction of the first applied field AMF1b is different from the direction of the first partial magnetic field MF1 by the absolute value $|dθ1n|$ of the first noise error dθ1n in the clockwise direction in FIG. 5, and the direction of the second applied field AMF2b is different from the direction of the second partial magnetic field MF2 by the absolute value $|dθ2n|$ of the second noise error dθ2n in the counterclockwise direction in FIG. 5. That is, in this case, the first noise error dθ1n takes on a positive value ($|dθ1n|$), and the second noise error dθ2n takes on a negative value ($|dθ2n|$). In this case also, when calculating the detected value θs, the value of the first noise error dθ1n and the value of the second noise error dθ2n are canceled out to make the absolute value of the error in the detected value θs smaller than both the absolute value of the first noise error dθ1n and the absolute value of the second noise error dθ2n.

The rotating field sensor could include only one of the first detection unit 10 and the second detection unit 20 to provide one of the first detected angle value θ1s and the second detected angle value θ2s as the detected value θs. In this case, the error contained in the detected value θs is either the first noise error dθ1n or the second noise error dθ2n. In contrast to this, the rotating field sensor according to the present embodiment includes both the first detection unit 10 and the second detection unit 20 to calculate the detected value θs using the equation (6). In the present embodiment, the first noise error dθ1n and the second noise error dθ2n have values of opposite sign not only in the aforementioned example but also in other cases except where both the first noise error dθ1n and the second noise error dθ2n are 0. Accordingly, as described above, when the third arithmetic circuit 30 calculates the detected value θs, the absolute value of the error contained in the detected value θs becomes smaller than both the absolute value of the first noise error dθ1n and the absolute value of the second noise error dθ2n. Consequently, according to the present embodiment, it is possible to reduce the error in the detected angle resulting from the noise field $H_{ext}$.

In the present embodiment, the first detection unit 10 including the first and second detection circuits 11 and 12 is located in the first position, and the second detection unit 20 including the third and fourth detection circuits 21 and 22 is located in the second position. This allows reducing the installation locations of the first to fourth detection circuits 11, 12, 21, and 22 as compared to a case where the first to fourth detection circuits 11, 12, 21, and 22 are installed in respective different positions. Each of the first to fourth detection circuits 11, 12, 21, and 22 includes at least one MR element. According to the present embodiment, since the installation locations of the first to fourth detection circuits 11, 12, 21, and 22 are reduced as mentioned above, the installation locations of the MR elements included in the detection circuits 11, 12, 21, and 22 are also reduced. Consequently, the present embodiment makes it possible to reduce the installation locations of the magnetic detection elements (MR elements) while reducing the error in the detected angle resulting from the noise field $H_{ext}$.

MODIFICATION EXAMPLES

Figure 7:
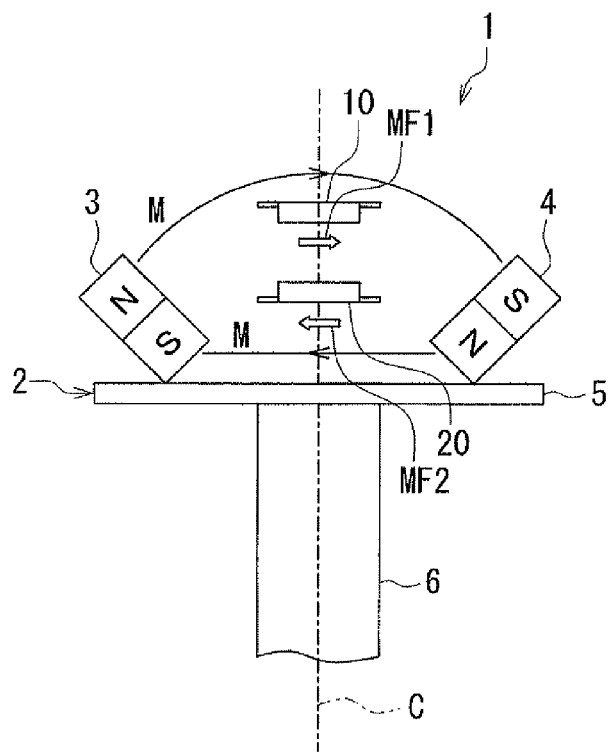
FIG. 7 is a side view showing the general configuration of a rotating field sensor of a first modification example of the first embodiment of the invention.

First and second modification examples of the present embodiment will now be described. First, a description will be given of a rotating field sensor 1 of the first modification example of the embodiment with reference to FIG. 7. FIG. 7 is a side view showing the general configuration of the rotating field sensor 1 of the first modification example. In the first modification example, the pair of magnets 3 and 4 are tilted with respect to the center of rotation C so that the distance between the magnets 3 and 4 increases with increasing distance from the top surface of the disc part 5. The N and S poles of the magnet 3 are arranged obliquely to the center of rotation C, in the order of the S pole and the N pole in the direction away from the top surface of the disc part 5. The N and S poles of the magnet 4 are arranged obliquely to the center of rotation C, in the order of the N pole and the S pole in the direction away from the top surface of the disc part 5.

In FIG. 7, the major portion of the magnetic flux from the N pole of the magnet 3 to the S pole of the magnet 4 and the major portion of the magnetic flux from the N pole of the magnet 4 to the S pole of the magnet 3 are shown by the curve and the straight line each designated by symbol M. The major portions of these magnetic fluxes are shifted upward in FIG. 7 as compared with the case where the pair of magnets 3 and 4 are not tilted with respect to the center of rotation C (FIG. 2). If the pair of magnets 3 and 4 are not tilted with respect to the center of rotation C, as shown in FIG. 2, the major portion of the magnetic flux from the N pole of the magnet 4 to the S pole of the magnet 3 may pass below the top surface of the disc unit 5. In such a case, it is sometimes difficult to locate the second detection unit 20 in an optimum position, i.e., the position where the major portion of the magnetic flux from the N pole of the magnet 4 to the S pole of the magnet 3 passes. In contrast, according to the first modification example, it is possible to adjust the distribution of the magnetic fluxes so that the major portion of the magnetic flux from the N pole of the magnet 4 to the S pole of the magnet 3 passes above the top surface of the disc part 5. This facilitates installing the second detection unit 20 in an optimum position.

Figure 8:
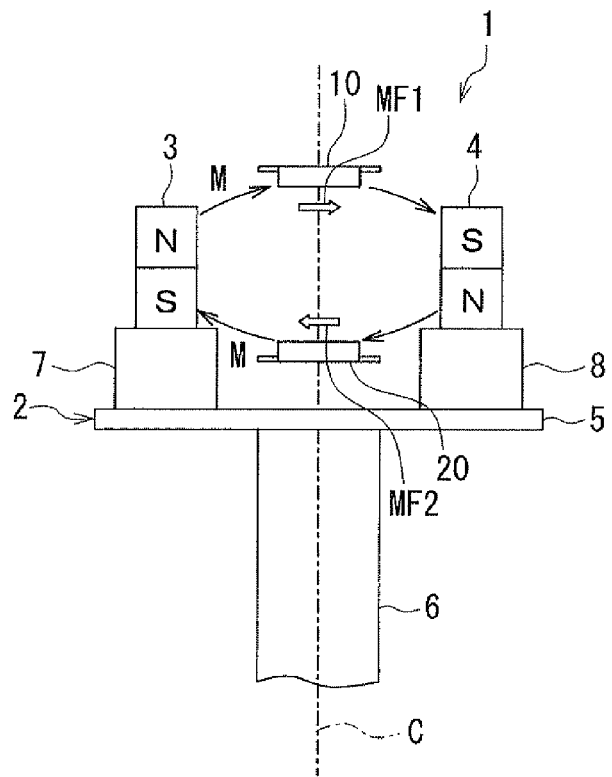
FIG. 8 is a side view showing the general configuration of a rotating field sensor of a second modification example of the first embodiment of the invention.

Reference is now made to FIG. 8 to describe a rotating field sensor 1 of the second modification example of the present embodiment. FIG. 8 is a side view showing the general configuration of the rotating field sensor 1 of the second modification example. In the second modification example, the pair of magnets 3 and 4 are located away from the top surface of the disc part 5. In addition to the components of the field generation unit 2 of the embodiment shown in FIG. 1 and FIG. 2, the field generation unit 2 of this modification example includes supporters 7 and 8 secured to the top surface of the disc part 5. The magnets 3 and 4 are fixed on the supporters 7 and 8, respectively.

In FIG. 8, the major portion of the magnetic flux from the N pole of the magnet 3 to the S pole of the magnet 4 and the major portion of the magnetic flux from the N pole of the magnet 4 to the S pole of the magnet 3 are shown by the curves designated by symbol M. These major portions of the magnetic fluxes are shifted upward in FIG. 8 as compared with the case where the magnets 3 and 4 are fixed to the top surface of the disc part 5 (FIG. 2). Consequently, according to the second modification example, it is possible to install the second detection unit 20 in an optimum position easily, as with the first modification example.

Second Embodiment

Figure 9:
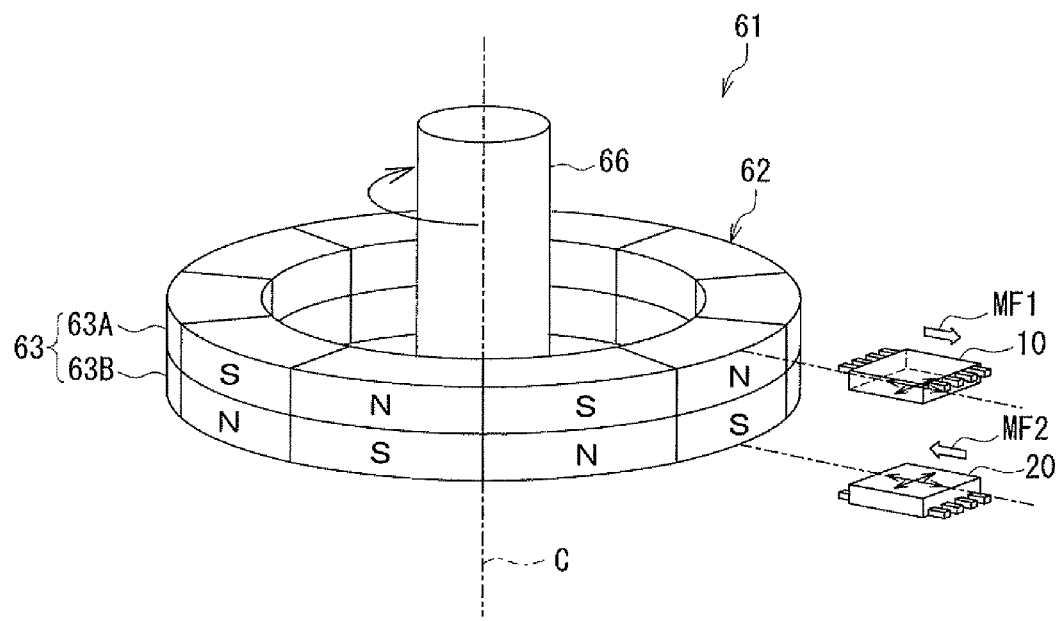
FIG. 9 is a perspective view showing the general configuration of a rotating field sensor according to a second embodiment of the invention.
Figure 10:
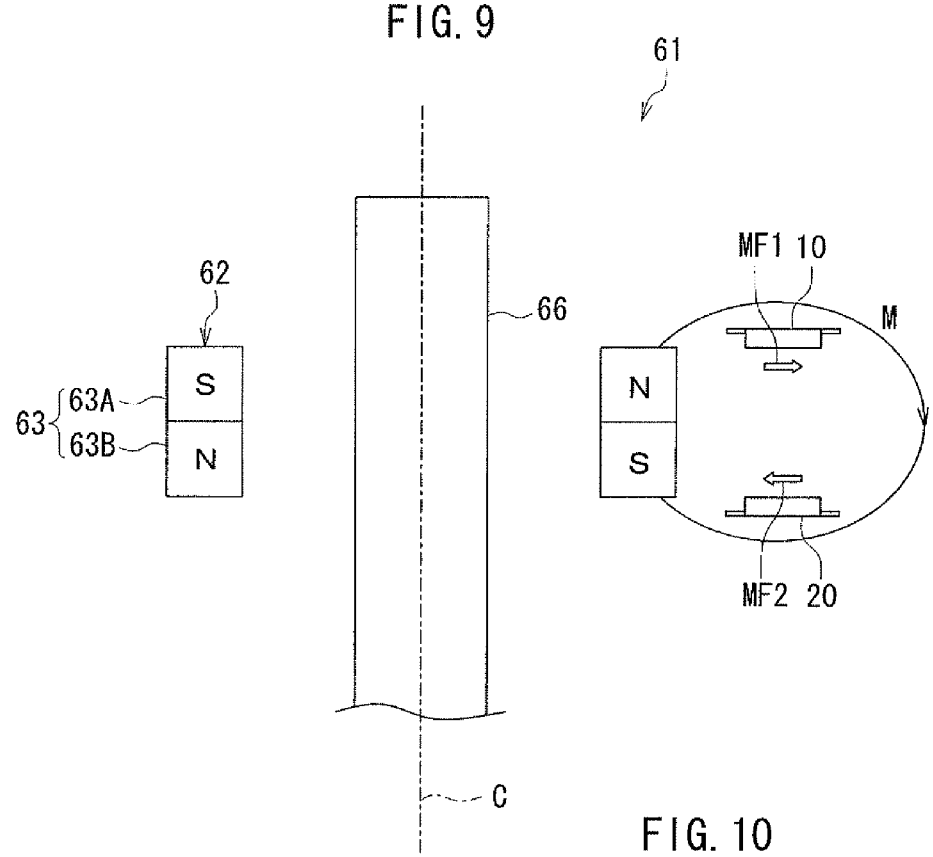
FIG. 10 is a side view showing the general configuration of the rotating field sensor according to the second embodiment of the invention.

A rotating field sensor according to a second embodiment of the invention will now be described with reference to FIG. 9 and FIG. 10. FIG. 9 is a perspective view showing the general configuration of the rotating field sensor according to the present embodiment. FIG. 10 is a side view showing the general configuration of the rotating field sensor according to the present embodiment. As shown in FIG. 9 and FIG. 10, the rotating field sensor 61 according to the present embodiment has a field generation unit 62 instead of the field generation unit 2 of the first embodiment.

The field generation unit 62 has a ring-shaped magnet 63. The magnet 63 is attached to a rotating shaft 66 which is the object whose rotational position is to be detected. In FIG. 9 and FIG. 10, the dot-and-dash line designated by symbol C shows the center of rotation including the center axis of the rotating shaft 66. The magnet 63 is fixed to the rotating shaft 66 by not-shown fixing means so as to be symmetrical about the center of rotation C. The magnet 63 rotates about the center of rotation C along with the rotating shaft 66. As a result, a rotating magnetic field occurs based on the magnetic field generated by the magnet 63.

The magnet 63 includes a first layer 63A and a second layer 63B. In each of the first and second layers 63A and 63B, one or more pairs of N and S poles are alternately arranged in a ring shape. The first layer 63A and the second layer 63B are stacked in the vertical direction (the direction parallel to the center of rotation C) in FIG. 9 and FIG. 10. The N poles of the first layer 63A are arranged to be vertically adjacent to the S poles of the second layer 63B. The S poles of the first layer 63A are arranged to be vertically adjacent to the N poles of the second layer 63B.

As shown in FIG. 9 and FIG. 10, the first and second detection units 10 and 20 are located outside the outer periphery of the magnet 63 and arranged in the direction parallel to the center of rotation C. The position where the first detection unit 10 is located is the first position. The position where the second detection unit 20 is located is the second position. The first position lies above a virtual plane that includes the interface between the first layer 63A and the second layer 63B. The second position is below the virtual plane. The rotating magnetic field includes a first partial magnetic field MF1 in the first position and a second partial magnetic field MF2 in the second position. Magnetic fluxes in the vicinity of the first layer 63A produce most of the first partial magnetic field MF1. The magnetic fluxes in the vicinity of the first layer 63A include a magnetic flux between two different poles of the first and second layers 63A and 63B that are vertically adjacent to each other, and a magnetic flux between two different poles of the first layer 63A that are adjacent to each other in the direction of rotation. Magnetic fluxes in the vicinity of the second layer 63B produce most of the second partial magnetic field MF2. The magnetic fluxes in the vicinity of the second layer 63B include a magnetic flux between two different poles of the first and second layers 63A and 63B that are vertically adjacent to each other, and a magnetic flux between two different poles of the second layer 63B that are adjacent to each other in the direction of rotation. In FIG. 10, the major portion of the magnetic flux from an N pole of the first layer 63A to an S pole of the second layer 63B is shown by the curve designated by symbol M. The first partial magnetic field MF1 and the second partial magnetic field MF2 differ in direction by 180° and rotate in the same direction of rotation.

The first detection unit 10 detects, in the first position, the first angle that the direction of the first applied field forms with respect to the first direction D1. The first applied field includes the first partial magnetic field MF1 as its main component. The second detection unit 20 detects, in the second position, the second angle that the direction of the second applied field forms with respect to the second direction D2. The second applied field includes the second partial magnetic field MF2 as its main component. The first direction D1 and the second direction D2 are different from each other by 180°. The first direction D1 is, for example, from the center of rotation C to the first detection unit 10.

In the example shown in FIG. 9, each of the first layer 63A and the second layer 63B includes five pairs of N and S poles. One rotation of the magnet 63 produces five rotations of the first partial magnetic field MF1 and the second partial magnetic field MF2. In this case, one period of the output signals of the detection circuits 11, 12, 21, and 22, i.e., an electrical angle of 360°, is equivalent to a one-fifth rotation of the magnet 63, i.e., an angle of rotation of 72° of the magnet 63.

Modification Example

Figure 11:
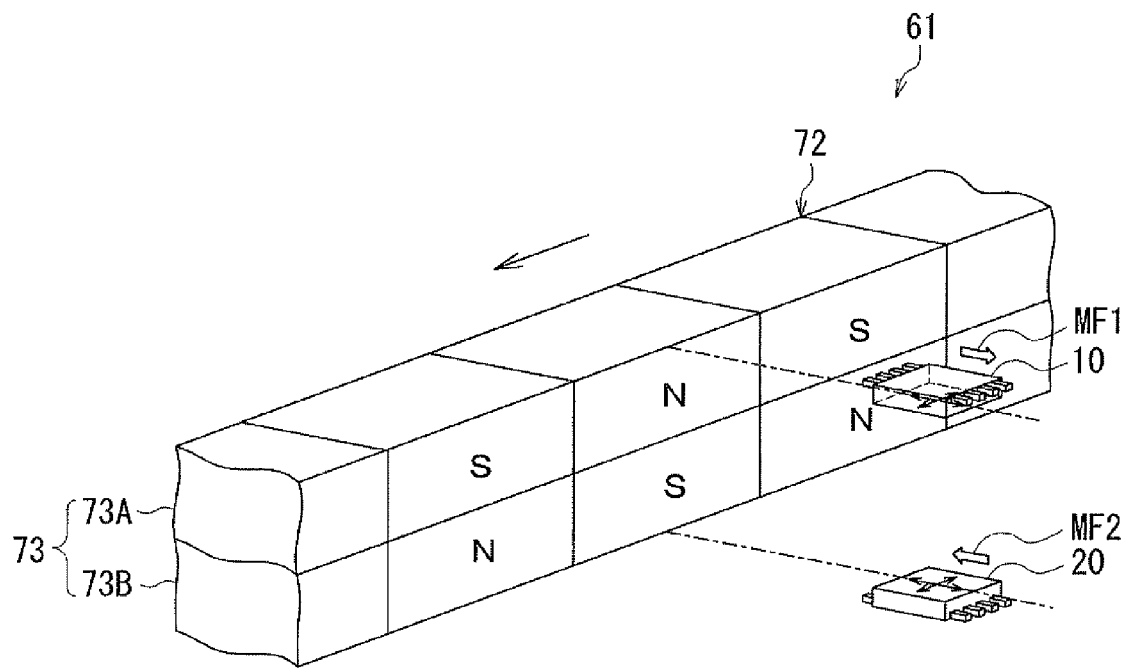
FIG. 11 is a perspective view showing the general configuration of a rotating field sensor of a modification example of the second embodiment of the invention.

A modification example of the present embodiment will now be described with reference to FIG. 11. FIG. 11 is a side view showing the general configuration of a rotating field sensor 61 of the modification example of the present embodiment. As shown in FIG. 11, the rotating field sensor 61 of the modification example has a field generation unit 72 instead of the field generation unit 62.

The field generation unit 72 includes a magnet 73 that is long in one direction. The magnet 73 makes a straight movement in its longitudinal direction along with a straight movement of the object. As a result, a rotating magnetic field occurs based on the magnetic field generated by the magnet 73. The magnet 73 includes a first layer 73A and a second layer 73B each of which has a plurality of pairs of N and S poles alternately arranged in a line. The first layer 73A and the second layer 73B are stacked in the vertical direction in FIG. 11 (the direction orthogonal to the direction of movement of the magnet 73). The N poles of the first layer 73A are arranged to be vertically adjacent to the S poles of the second layer 73B. The S poles of the first layer 73A are arranged to be vertically adjacent to the N poles of the second layer 73B.

As shown in FIG. 11, the first and second detection units 10 and 20 are located beside the magnet 73 and arranged in the vertical direction in FIG. 11 (the stacking direction of the first layer 73A and the second layer 73B). The position where the first detection unit 10 is located is the first position. The position where the second detection unit 20 is located is the second position. The first position lies above a virtual plane that includes the interface between the first layer 73A and the second layer 73B. The second position is below the virtual plane. The rotating magnetic field includes a first partial magnetic field MF1 in the first position and a second partial magnetic field MF2 in the second position. Magnetic fluxes in the vicinity of the first layer 73A produce most of the first partial magnetic field MF1. The magnetic fluxes in the vicinity of the first layer 73A include a magnetic flux between two different poles of the first and second layers 73A and 73B that are vertically adjacent to each other, and a magnetic flux between two different poles of the first layer 73A that are adjacent to each other in the direction of movement of the magnet 73. Magnetic fluxes in the vicinity of the second layer 73B produce most of the second partial magnetic field MF2. The magnetic fluxes in the vicinity of the second layer 73B include a magnetic flux between two different poles of the first and second layers 73A and 73B that are vertically adjacent to each other, and a magnetic flux between two different poles of the second layer 73B that are adjacent to each other in the direction of movement of the magnet 73. The first partial magnetic field MF1 and the second partial magnetic field MF2 differ in direction by 180° and rotate in the same direction of rotation.

The first detection unit 10 detects, in the first position, the first angle that the direction of the first applied field forms with respect to the first direction D1. The first applied field includes the first partial magnetic field MF1 as its main component. The second detection unit 20 detects, in the second position, the second angle that the direction of the second applied field forms with respect to the second direction D2. The second applied field includes the second partial magnetic field MF2 as its main component. The first direction D1 and the second direction D2 are different from each other by 180°. The first direction D1 is, for example, perpendicular to the side surface of the magnet 73 facing the first detection unit 10, and from the magnet 73 to the first detection unit 10.

While the magnet 73 moves by one pitch, i.e., as much as a pair of N and S poles, each of the first partial magnetic field MF1 and the second partial magnetic pole MF2 makes one rotation. In this case, one period of the output signals of the detection circuits 11, 12, 21, and 22, i.e., an electrical angle of 360°, is equivalent to one pitch of the magnet 73.

The other configuration, operation, and effects of the present embodiment are the same as those of the first embodiment.

Third Embodiment

Figure 12:
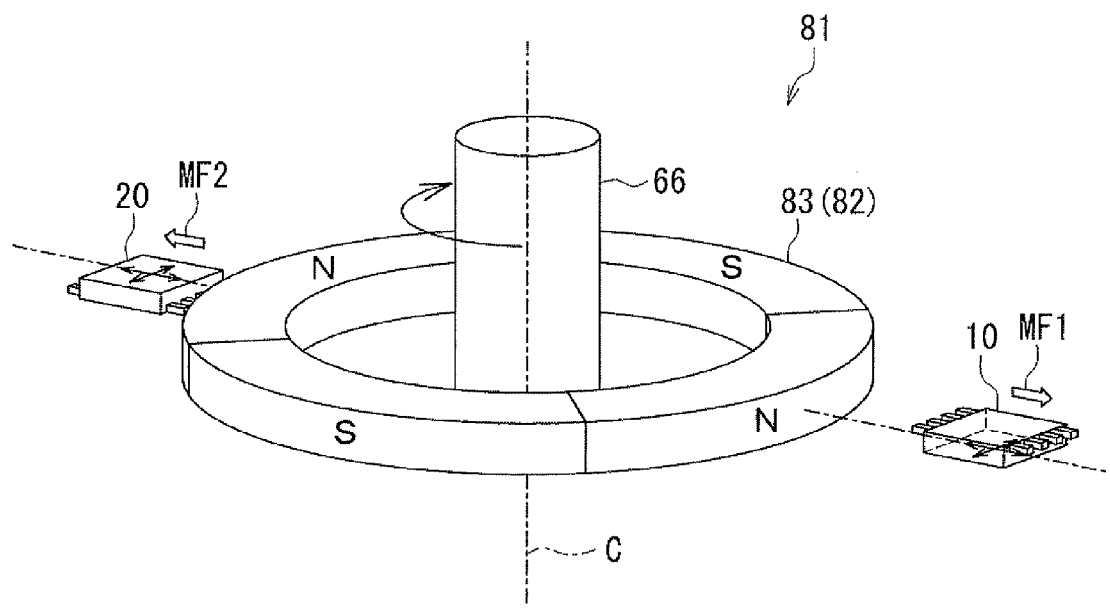
FIG. 12 is a perspective view showing the general configuration of a rotating field sensor according to a third embodiment of the invention.

A rotating field sensor according to a third embodiment of the invention will now be described with reference to FIG. 12. FIG. 12 is a perspective view showing the general configuration of the rotating field sensor according to the present embodiment. As shown in FIG. 12, the rotating field sensor 81 according to the present embodiment has a field generation unit 82 instead of the field generation unit 62 of the second embodiment.

The field generation unit 82 has a ring-shaped magnet 83. The magnet 83 is attached to a rotating shaft 66 which is the object whose rotational position is to be detected. In FIG. 12, the dot-and-dash line designated by symbol C shows the center of rotation including the center axis of the rotating shaft 66. The magnet 83 is fixed to the rotating shaft 66 by not-shown fixing means so as to be symmetrical about the center of rotation C. The magnet 83 rotates about the center of rotation C along with the rotating shaft 66. As a result, a rotating magnetic field occurs based on the magnetic field generated by the magnet 83. The magnet 83 is composed of 2n pairs (n is an integer equal to or greater than 1) of N and S poles that are alternately arranged in a ring shape. In the example shown in FIG. 12, the magnet 83 includes two pairs of N and S poles.

As shown in FIG. 12, the first and second detection units 10 and 20 are arranged with the magnet 83 therebetween, in symmetrical positions with respect to a virtual plane that includes the center of rotation C. The position where the first detection unit 10 is located is the first position. The position where the second detection unit 20 is located is the second position. The rotating magnetic field includes a first partial magnetic field MF1 in the first position and a second partial magnetic field MF2 in the second position. The first partial magnetic field MF1 and the second partial magnetic field MF2 differ in direction by 180° and rotate in the same direction of rotation.

The first detection unit 10 detects, in the first position, the first angle that the direction of the first applied field forms with respect to the first direction D1. The first applied field includes the first partial magnetic field MF1 as its main component. The second detection unit 20 detects, in the second position, the second angle that the direction of the second applied field forms with respect to the second direction D2. The second applied field includes the second partial magnetic field MF2 as its main component. The first direction D1 and the second direction D2 are different from each other by 180°. The first direction D1 is, for example, from the center of rotation C to the first detection unit 10.

In the example shown in FIG. 12, one rotation of the magnet 83 produces two rotations of the first partial magnetic field MF1 and the second partial magnetic field MF2. In this case, one period of the output signals of the detection circuits 11, 12, 21, and 22, i.e., an electrical angle of 360°, is equivalent to a one-half rotation of the magnet 83, i.e., an angle of rotation of 180° of the magnet 83.

Modification Example

Figure 13:
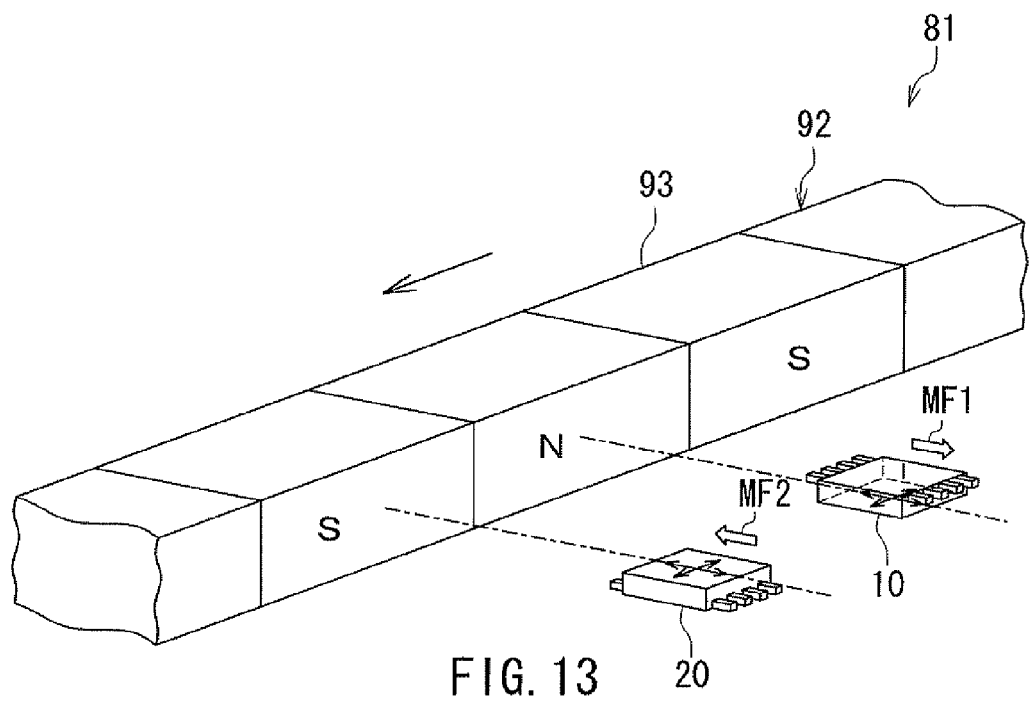
FIG. 13 is a perspective view showing the general configuration of a rotating field sensor of a modification example of the third embodiment of the invention.

A modification example of the present embodiment will now be described with reference to FIG. 13. FIG. 13 is a side view showing the general configuration of a rotating field sensor 81 of the modification example of the present embodiment. As shown in FIG. 13, the rotating field sensor 81 of the modification example has a field generation unit 92 instead of the field generation unit 82.

The field generation unit 92 includes a magnet 93 that is long in one direction. The magnet 93 makes a straight movement in its longitudinal direction along with a straight movement of the object. As a result, a rotating magnetic field occurs based on the magnetic field generated by the magnet 93. The magnet 93 is composed of a plurality of pairs of N and S poles that are alternately arranged in a line.

As shown in FIG. 13, the first and second detection units 10 and 20 are located beside the magnet 93 and arranged in a direction parallel to the direction of movement of the magnet 93. The second detection unit 20 is located in a position offset from the position of the first detection unit 10 by one half pitch of the magnet 93. The position where the first detection unit 10 is located is the first position. The position where the second detection unit 20 is located is the second position. The rotating magnetic field includes a first partial magnetic field MF1 in the first position and a second partial magnetic field MF2 in the second position. The first partial magnetic field MF1 and the second partial magnetic field MF2 differ in direction by 180° and rotate in the same direction of rotation.

The first detection unit 10 detects, in the first position, the first angle that the direction of the first applied field forms with respect to the first direction D1. The first applied field includes the first partial magnetic field MF1 as its main component. The second detection unit 20 detects, in the second position, the second angle that the direction of the second applied field forms with respect to the second direction D2. The second applied field includes the second partial magnetic field MF2 as its main component. The first direction D1 and the second direction D2 are different from each other by 180°. The first direction D1 is, for example, perpendicular to the side surface of the magnet 93 facing the first detection unit 10, and from the magnet 93 to the first detection unit 10.

While the magnet 93 moves by one pitch, each of the first partial magnetic field MF1 and the second partial magnetic pole MF2 makes one rotation. In this case, one period of the output signals of the detection circuits 11, 12, 21, and 22, i.e., an electrical angle of 360°, is equivalent to one pitch of the magnet 93.

The other configuration, operation, and effects of the present embodiment are the same as those of the second embodiment.

Fourth Embodiment

Figure 14:
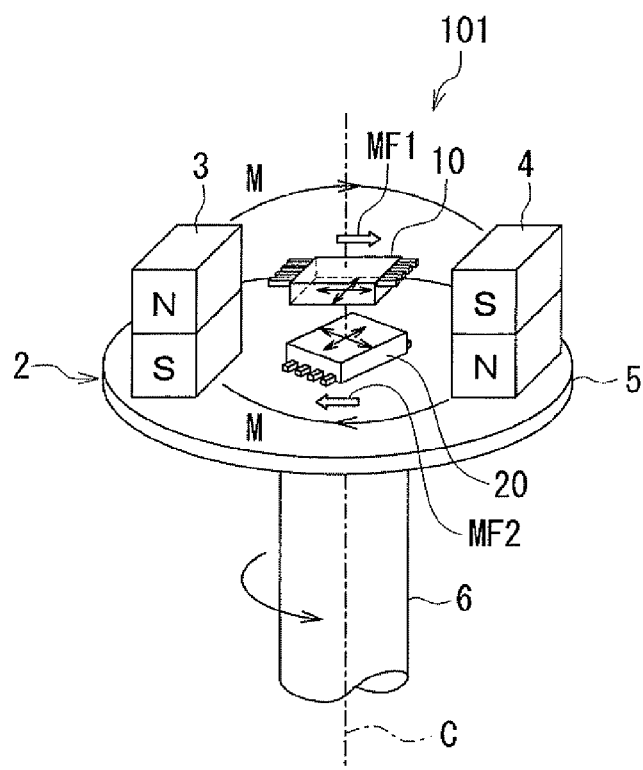
FIG. 14 is a perspective view showing the general configuration of a rotating field sensor according to a fourth embodiment of the invention.

A rotating field sensor according to a fourth embodiment of the invention will now be described with reference to FIG. 14. FIG. 14 is a perspective view showing the general configuration of the rotating field sensor according to the present embodiment. The configuration of the rotating field sensor 101 according to the present embodiment is basically the same as that of the rotating field sensor 1 according to the first embodiment.

In the present embodiment, the relationship between the first direction D1, i.e., the reference direction with respect to which the first detection unit 10 indicates the direction of the first applied field, and the second direction D2, i.e., the reference direction with respect to which the second detection unit 20 indicates the direction of the second applied field, is different from that in the first embodiment. More specifically, the first direction D1 and the second direction D2 are different from each other by an odd number of times 45° in the rotational direction of the first and second partial magnetic fields MF1 and MF2. To achieve such a difference, in the example shown in FIG. 14, the second detection unit 20 is situated in an orientation different from that in the first embodiment. In the example shown in FIG. 14, the second detection unit 20 is situated in an orientation 45° rotated in the rotational direction of the field generation unit 2 from the state of the first embodiment shown in FIG. 1 within a virtual plane perpendicular to the center of rotation C. The first detection unit 10 is in the same orientation as in the first embodiment shown in FIG. 1. In this case, the first direction D1 and the second direction D2 are different from each other by 180°+45°, i.e., 225° (five times 45°) in the rotational direction of the first and second partial magnetic fields MF1 and MF2. It should be appreciated that instead of situating the second detection unit 20 in the foregoing orientation, the directions of magnetization of the magnetization pinned layers in the MR elements that are included in the second detection unit 20 may be rotated by 45° in the rotational direction of the field generation unit 2 with respect to those of the first embodiment. Otherwise, the first detection unit 10 may be situated in an orientation −45° rotated in the rotational direction of the field generation unit 2 from the state shown in FIG. 1 within a virtual plane perpendicular to the center of rotation C. Alternatively, the directions of magnetization of the magnetization pinned layers in the MR elements that are included in the first detection unit 10 may be rotated by −45° in the rotational direction of the field generation unit 2 with respect to those of the first embodiment.

In the present embodiment, the first detected angle value $\theta 1s$, i.e., the detected value of the first angle $\theta 1$ that the direction of the first applied field forms with respect to the first direction D1, and the second detected angle value $\theta 2s$, i.e., the detected value of the second angle $\theta 2$ that the direction of the second applied field forms with respect to the second direction D2, differ in phase by an odd number of times $\pi/4$ (an electrical angle of 45°). In the example shown in FIG. 14, the first partial magnetic field MF1 and the second partial magnetic field MF2 differ in direction by 180°. Furthermore, the first direction D1 and the second direction D2 differ by 225° in the rotational direction of the first and second partial magnetic fields MF1 and MF2. Accordingly, the first detected angle value $\theta 1s$ and the second detected angle value $\theta 2s$ differ in phase by $\pi/4$ (an electrical angle of 45°). In this case, the third arithmetic circuit 30 uses the following equation (7) to calculate the detected value $\theta s$ having a correspondence relationship with the angle that the direction of the rotating magnetic field in the reference position forms with respect to the reference direction.

$$\theta s=(\theta 1s+\theta 2s+\pi/4)/2 \tag{7}$$

Now, the operation and effects of the rotating field sensor 101 will be described. In the rotating field sensor 101, the third arithmetic circuit 30 calculates the detected value $\theta s$ using the equation (7), based on the first detected angle value $\theta 1s$ calculated based on the output signals of the first and second detection circuits 11 and 12 of the first detection unit 10 and the second detected angle value $\theta 2s$ calculated based on the output signals of the third and fourth detection circuits 21 and 22 of the second detection unit 20. The detected value $\theta s$ has a correspondence relationship with the angle that the direction of the rotating magnetic field in the reference position forms with respect to the reference direction.

Figure 15:
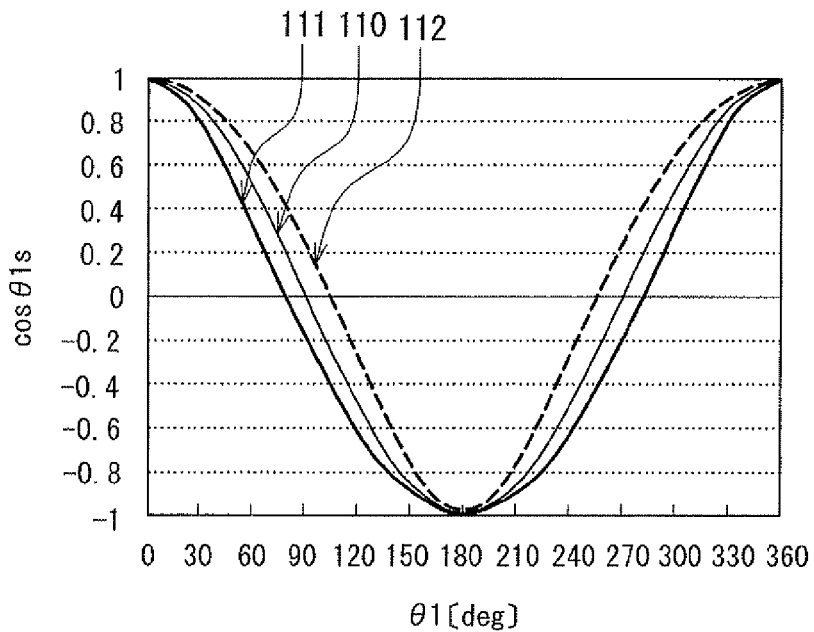
FIG. 15 is a waveform chart showing how the output signals of the detection circuits of the rotating field sensor according to the fourth embodiment of the invention are distorted in waveform.

As described in relation to the first embodiment, the output signals of the detection circuits 11, 12, 21, and 22 ideally have sinusoidal waveforms (including a sine waveform and a cosine waveform). In actuality, however, distortion of the output signal waveforms of the MR elements occurring due to the MR elements themselves distorts the waveforms of the output signals of the detection circuits 11, 12, 21, and 22 from a sinusoidal curve. Examples of the situation where the output signal waveforms of the MR elements are distorted due to the MR elements themselves include: when the directions of magnetization of the magnetization pinned layers in the MR elements vary due to the influence of the rotating magnetic field or the like; and when the directions of magnetization of the free layers in the MR elements do not coincide with the direction of the first applied field or the second applied field due to the influence of such factors as the shape anisotropy and coercivity of the free layers. FIG. 15 illustrates how the output signals of the detection circuits are distorted in waveform. FIG. 15 shows the waveform of the output signal of the detection circuit 12 which typifies the detection circuits 11, 12, 21, and 22. In FIG. 15, the horizontal axis indicates the angle $\theta 1$, and the vertical axis indicates the output signal cos $\theta 1s$ of the detection circuit 12. The reference numeral 110 designates an ideal sinusoidal curve. The two waveforms designated by the reference numerals 111 and 112 show waveforms that are distorted due to the MR elements.

Because the output signals of the detection circuits 11 and 12 are distorted in waveform due to the MR elements as described above, the first detected angle value $\theta 1s$ includes a first angular error with respect to a theoretical value of the first angle $\theta 1$ that is expected when the first applied field consists only of the first partial magnetic field MF1 and the direction of the first partial magnetic field MF1 makes an ideal rotation. Likewise, because the output signals of the detection circuits 21 and 22 are distorted in waveform due to the MR elements, the second detected angle value $\theta 2s$ includes a second angular error with respect to a theoretical value of the second angle $\theta 2$ that is expected when the second applied field consists only of the second partial magnetic field MF2 and the direction of the second partial magnetic field MF2 makes an ideal rotation. In the present embodiment, the first angular error will be denoted by symbol $d\theta 1$, and the second angular error will be denoted by symbol $d\theta 2$. The first angular error $d\theta 1$ and the second angular error $d\theta 2$ make periodic changes with the same error period in response to changes of the directions of the first and second partial magnetic fields MF1 and MF2. The change of the first angular error dθ1 depends on a change of the first detected angle value θ1s, and the change of the second angular error dθ2 depends on a change of the second detected angle value θ2s. When the waveforms of the output signals of the detection circuits are distorted as shown in FIG. 15, the error period is ¼ the period of the output signals of the detection circuits, i.e., π/2 (an electrical angle of 90°).

Figure 16:
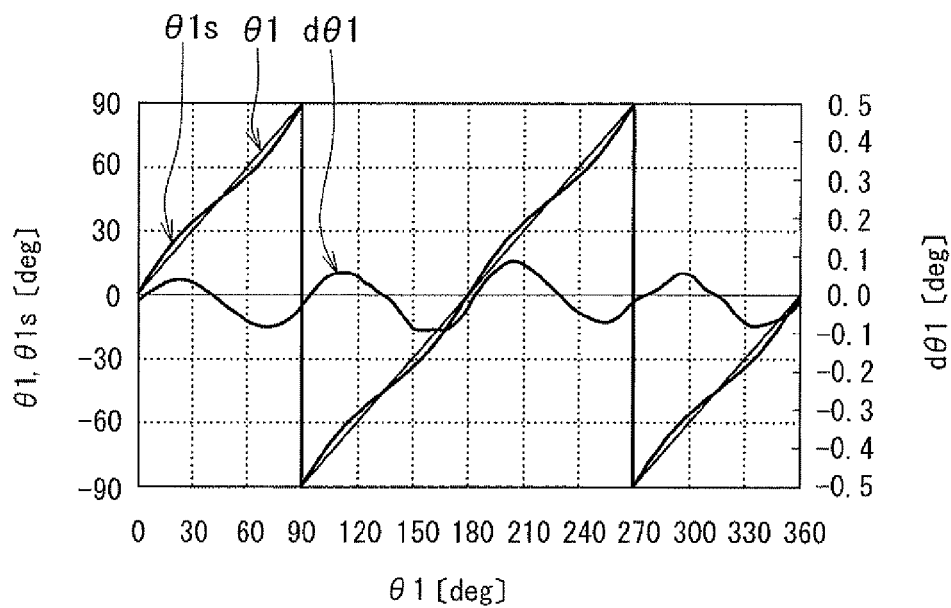
FIG. 16 is a waveform chart showing the relationship between a first detected angle value and a first angular error in the fourth embodiment of the invention.

FIG. 16 shows the relationship between the first detected angle value θ1s and the first angular error dθ1. In FIG. 16, the horizontal axis indicates the first angle θ1, and the vertical axis indicates the first angle θ1, the first detected angle value θ1s, and the first angular error dθ1. For the sake of convenience, FIG. 16 shows the angle θ1 and the first detected angle value θ1s on the vertical axis in values after a subtraction of 180° if the actual angles are in the range of 90° to 270°, and in values after a subtraction of 360° if the actual angles are in the range of 270° to 360°. In the following description, charts similar to FIG. 16 will be shown in the same way as with FIG. 16. The relationship between the second detected angle value θ2s and the second angular error dθ2 is the same as in FIG. 16. For ease of understanding, FIG. 16 shows the waveform of the first detected angle value θ1s with emphasis on the component of the angular error dθ1. The same holds for other charts that are similar to FIG. 16.

In the present embodiment, the first detected angle value θ1s and the second detected angle value θ2s differ in phase by an odd number of times ½ the error period, i.e., by an odd number of times π/4 (an electrical angle of) 45°). To achieve such a difference, the present embodiment is configured so that the first direction D1 and the second direction D2 are different from each other by an odd number of times ½ the error period (an electrical angle of 45°) in the rotational direction of the first and second partial magnetic fields MF1 and MF2. For example, suppose that the first direction D1 and the second direction D2 are different from each other by 225° or a spatial angle equivalent to five times ½ the error period (an electrical angle of 45°) in the rotational direction of the first and second partial magnetic fields MF1 and MF2. In this case, the first detected angle value θ1s and the second detected angle value θ2s differ in phase by ½ the error period, i.e., by π/4 (an electrical angle of 45°).

Figure 17:
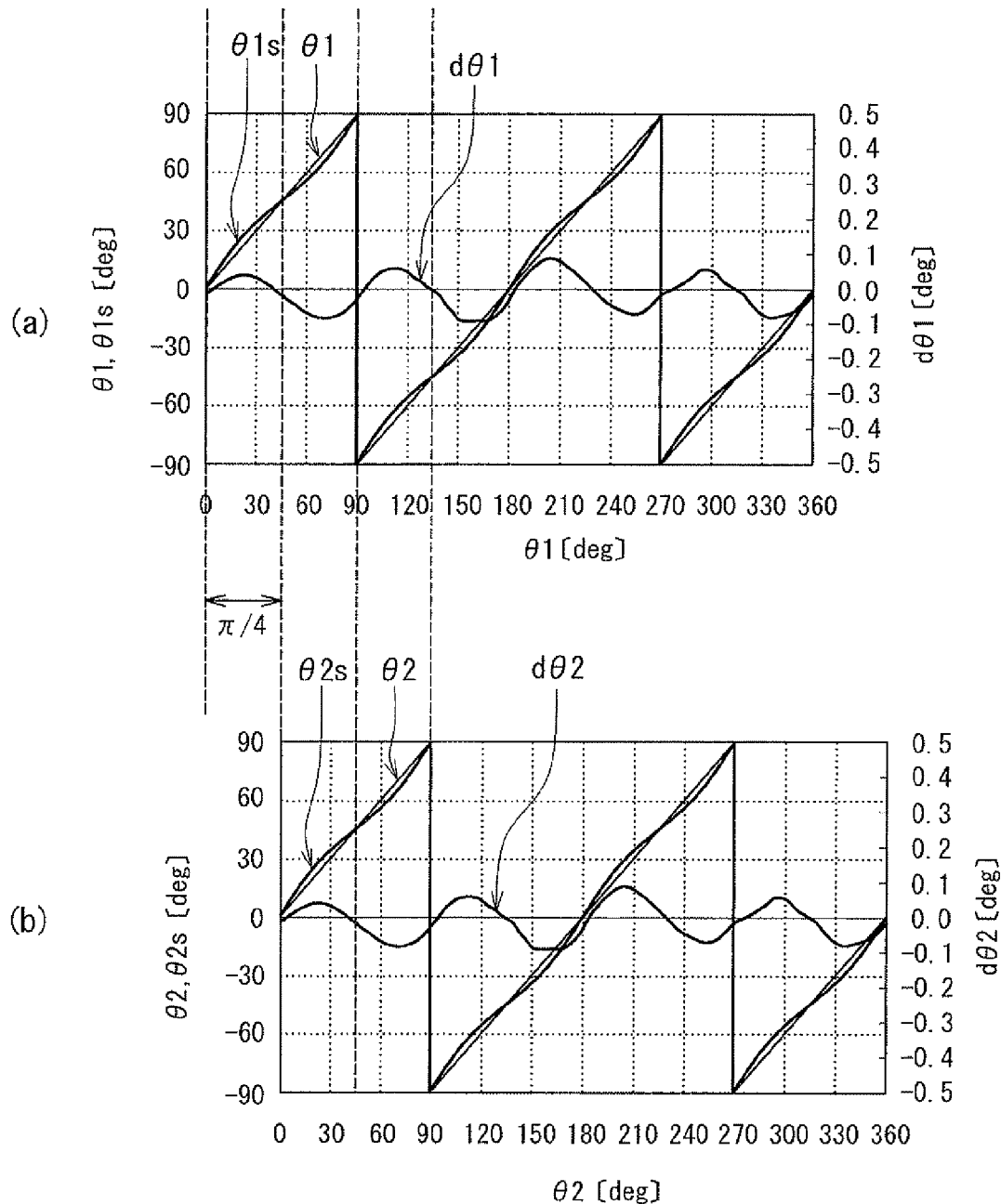
FIG. 17 is an explanatory diagram showing the operation of reducing an angular error in the fourth embodiment of the invention.

According to the present embodiment, it is possible to cancel out the first angular error dθ1 and the second angular error dθ2. This will be described with reference to FIG. 17 and FIG. 18. Portion (a) of FIG. 17 shows the relationship between the first detected angle value θ1s and the first angular error dθ1 shown in FIG. 16. Portion (b) of FIG. 17 shows the relationship between the second detected angle value θ2s and the second angular error dθ2. In the example shown in FIG. 17, the first angular error dθ1 and the second angular error dθ2 have an amplitude of ±0.09°. In the present embodiment, the first detected angle value θ1s and the second detected angle value θ2s are given a difference in phase by an odd number of times ½ the error period, i.e., by an odd number of times π/4. The detected value θs of the angle θ is then calculated by using the first detected angle value θ1s and the second detected angle value θ2s. When calculating the detected value θs, the first angular error dθ1 and the second angular error dθ2 are thus in opposite phases. Consequently, the first angular error dθ1 and the second angular error dθ2 cancel each other out.

Figure 18:
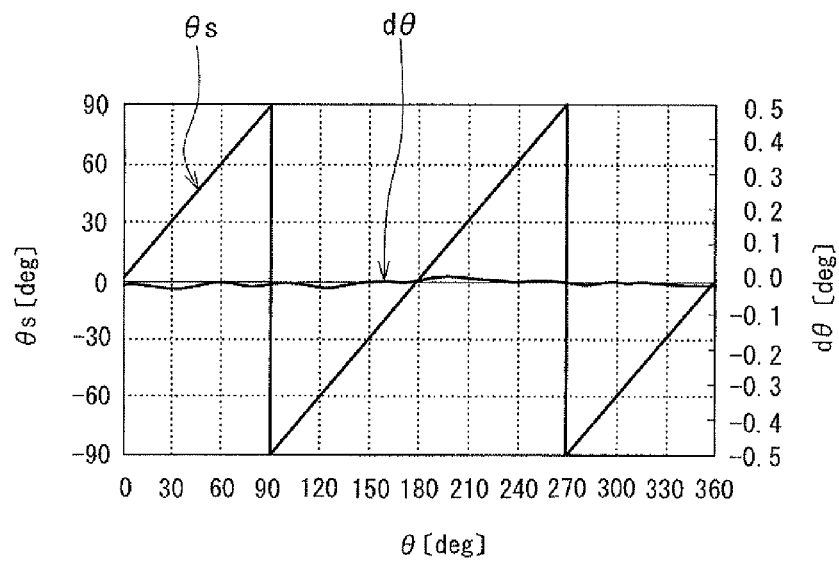
FIG. 18 is a waveform chart showing the relationship between a detected angle value and an angular error in the fourth embodiment of the invention.

FIG. 18 shows the relationship between the detected value θs calculated as described above and an angular error included in the detected value θs. In the present embodiment, the angular error included in the detected value θs will be denoted by symbol dθ. As shown in FIG. 18, the angular error dθ is significantly smaller than the first angular error dθ1 and the second angular error dθ2. In the example shown in FIG. 18, the angular error dθ has an amplitude of ±0.02°.

In the present embodiment, the detected angle is corrected by using the two detection units 10 and 20 which have exactly the same configuration except in the directions of magnetization of the magnetization pinned layers in the MR elements. Therefore, even if the angular errors in the respective detection units vary as a function of temperature, it is possible to cancel out the angular errors in the respective detection units, including temperature-based variations of the angular errors, to correct the detected angle. Consequently, according to the present embodiment, it is eventually possible to obtain a detected angle value with less temperature-based error variations.

The method of calculating the detected value θs in the present embodiment is the same as that in the first embodiment except that the phase difference between the first detected angle value θ1s and the second detected angle value θ2s is corrected in the present embodiment. Consequently, as discussed in relation to the first embodiment, when a noise field $H_{ext}$ other than the rotating magnetic field is applied to the rotating field sensor 101 from outside, the first noise error dθ1n in the first detected angle value θ1s resulting from the noise field $H_{ext}$ and the second noise error dθ2n in the second detected angle value θ2s resulting from the noise field $H_{ext}$ have values of opposite sign. For the same reason as in the description of the first embodiment, the present embodiment thus makes it possible to reduce the error in the detected value θs resulting from the noise field $H_{ext}$.

The other configuration, operation, and effects of the present embodiment are the same as those of the first embodiment. It should be noted that in the present embodiment, the field generation unit 2 may be configured as in the second or third embodiment with the first and second detection units 10 and 20 arranged such that the first direction D1 and the second direction D2 are different from each other by an odd number of times 45° in the rotational direction of the first and second partial magnetic fields MF1 and MF2.

Fifth Embodiment

Figure 19:
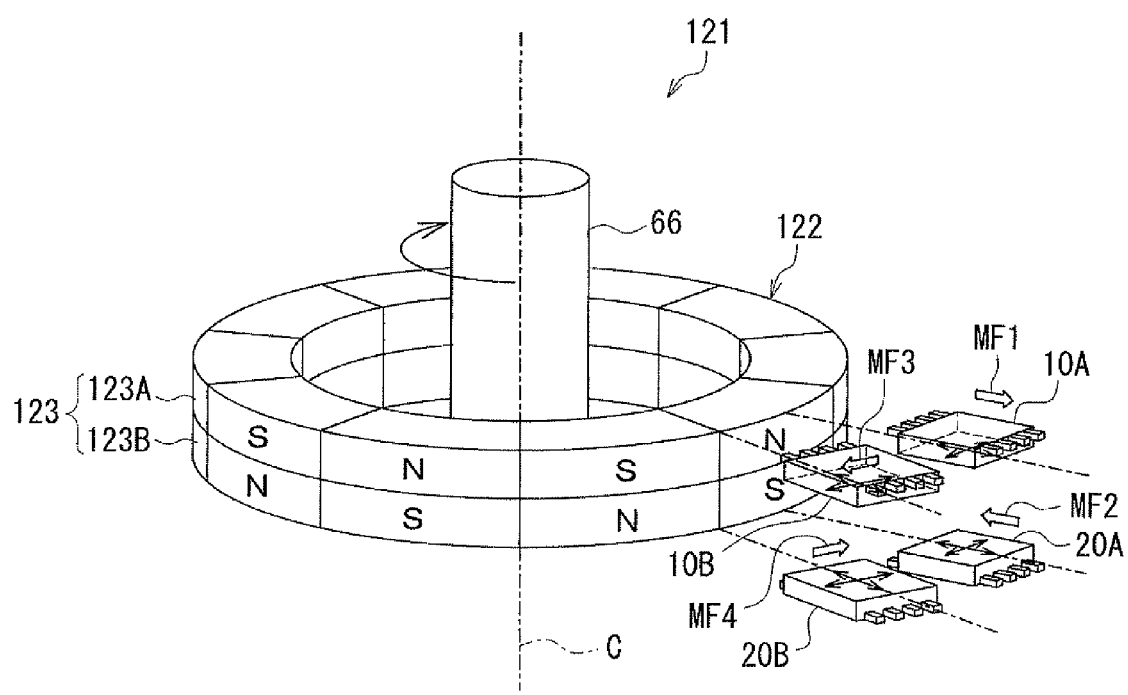
FIG. 19 is a perspective view showing the general configuration of a rotating field sensor according to a fifth embodiment of the invention.
Figure 20:
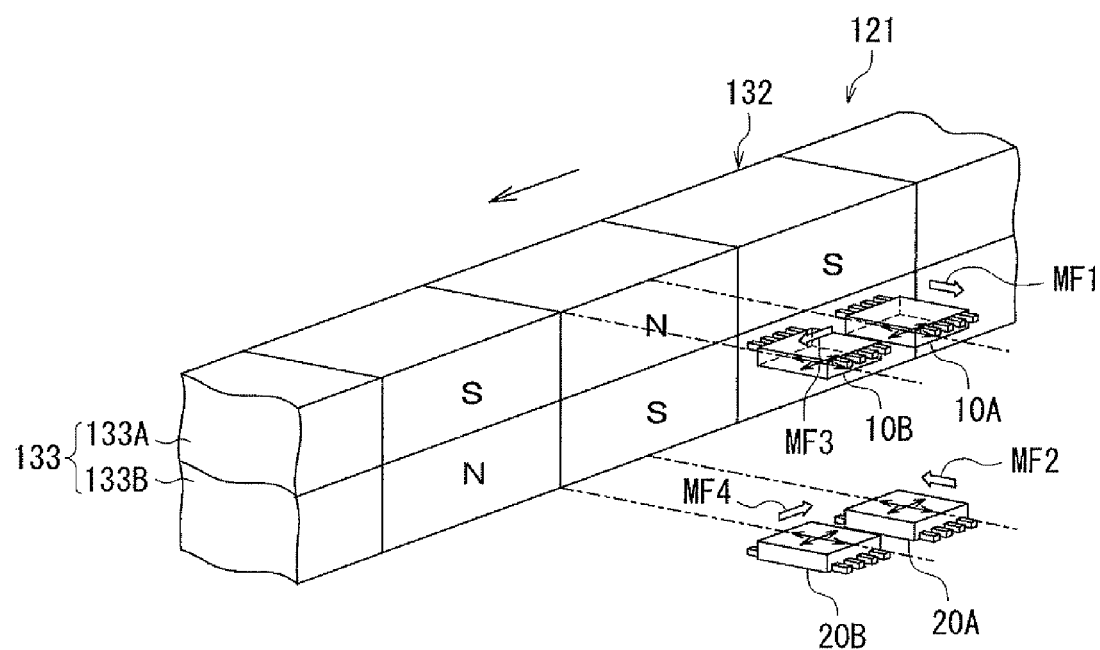
FIG. 20 is a perspective view showing the general configuration of a rotating field sensor of a modification example of the fifth embodiment of the invention.
Figure 21:
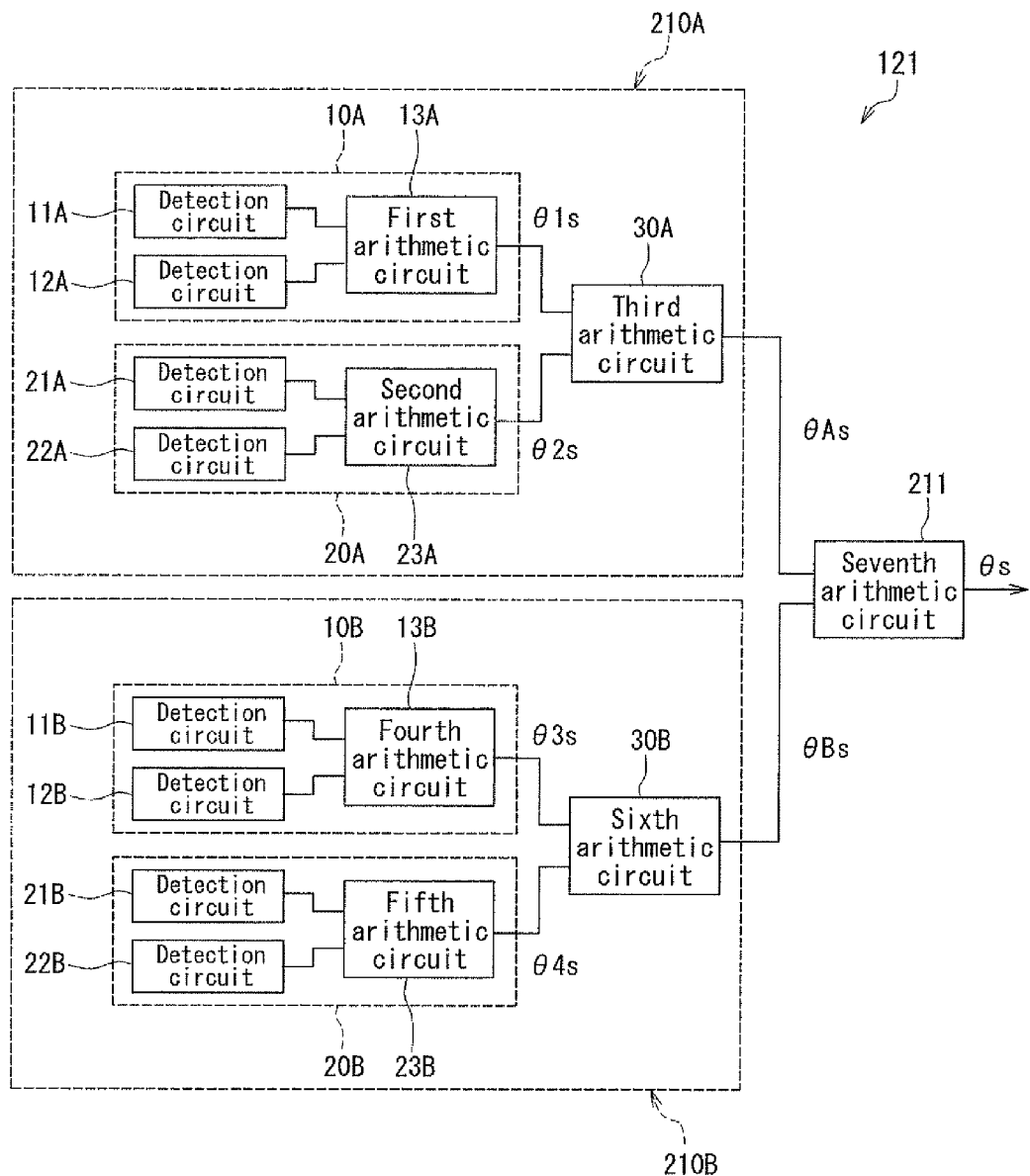
FIG. 21 is a block diagram showing the configuration of the rotating field sensor according to the fifth embodiment of the invention.

A rotating field sensor according to a fifth embodiment of the invention will now be described with reference to FIG. 19 to FIG. 21. FIG. 19 is a perspective view showing the general configuration of the rotating field sensor according to the present embodiment. FIG. 20 is a perspective view showing the general configuration of a rotating field sensor of a modification example of the present embodiment. FIG. 21 is a block diagram showing the configuration of the rotating field sensor according to the present embodiment. First, a description will be given of the configuration of the rotating field sensor 121 according to the present embodiment. As shown in FIG. 21, the rotating field sensor 121 has first and second composite detection units 210A and 210B.

Each of the composite detection units 210A and 210B has the same configuration as that of the rotating field sensor 1 of the first embodiment without the field generation unit 2. Specifically, the first composite detection unit 210A includes a first detection unit 10A, a second detection unit 20A, and a third arithmetic circuit 30A that are the same in configuration as the first detection unit 10, the second detection unit 20, and the third arithmetic circuit 30, respectively. Similarly, the second composite detection unit 210B includes a third detection unit 10B, a fourth detection unit 20B, and a sixth arithmetic circuit 30B that are the same in configuration as the first detection unit 10, the second detection unit 20, and the third arithmetic circuit 30, respectively. The first detection unit 10A is located in a first position, the second detection unit 20A is located in a second position, the third detection unit 10B is located in a third position, and the fourth detection unit 20B is located in a fourth position.

As shown in FIG. 19, the rotating field sensor 121 according to the present embodiment further includes a field generation unit 122 for generating a rotating magnetic field. The field generation unit 122 has the same configuration as that of the field generation unit 62 of the second embodiment. Specifically, the field generation unit 122 has a ring-shaped magnet 123 attached to a rotating shaft 66. The magnet 123 includes a first layer 123A and a second layer 123B that are the same in configuration as the first layer 63A and the second layer 63B, respectively.

The relative positional relationship of the first and second detection units 10A and 20A with respect to the magnet 123 is the same as that of the first and second detection units 10 and 20 with respect to the magnet 63 in the second embodiment. The relative positional relationship of the third and fourth detection units 10B and 20B with respect to the magnet 123 is also the same as that of the first and second detection units 10 and 20 with respect to the magnet 63 in the second embodiment. The third and fourth detection units 10B and 20B are located in positions offset from the positions of the first and second detection units 10A and 20A, respectively, by an amount equivalent to ¼ the period of the rotation of the rotating magnetic field, i.e., as much as an electrical angle of 90°.

The position where the first detection unit 10A is located is the first position. The position where the second detection unit 20A is located is the second position. The rotating magnetic field includes a first partial magnetic field MF1 in the first position and a second partial magnetic field MF2 in the second position. The first and second partial magnetic fields MF1 and MF2 are generated by the magnet 123 on the same principle as in the second embodiment. The first partial magnetic field MF1 and the second partial magnetic field MF2 differ in direction by 180° and rotate in the same direction of rotation.

The first detection unit 10A detects, in the first position, the first angle that the direction of the first applied field forms with respect to the first direction D1. The first applied field includes the first partial magnetic field MF1 as its main component. The second detection unit 20A detects, in the second position, the second angle that the direction of the second applied field forms with respect to the second direction D2. The second applied field includes the second partial magnetic field MF2 as its main component. The first direction D1 and the second direction D2 are different from each other by 180°. The first direction D1 is, for example, from the center of rotation C to the first detection unit 10A.

The position where the third detection unit 10B is located is the third position. The position where the fourth detection unit 20B is located is the fourth position. The rotating magnetic field further includes a third partial magnetic field MF3 in the third position and a fourth partial magnetic field MF4 in the fourth position. The third and fourth partial magnetic fields MF3 and MF4 are generated by the magnet 123 on the same principle as with the first and second partial magnetic fields MF1 and MF2. The third partial magnetic field MF3 and the fourth partial magnetic field MF4 differ in direction by 180° and rotate in the same direction of rotation as that of the first and second partial magnetic fields MF1 and MF2.

The third detection unit 10B detects, in the third position, a third angle that the direction of a third applied field forms with respect to a third direction. The third applied field includes the third partial magnetic field MF3 as its main component. The fourth detection unit 20B detects, in the fourth position, a fourth angle that the direction of a fourth applied field forms with respect to a fourth direction. The fourth applied field includes the fourth partial magnetic field MF4 as its main component. The third direction is a reference direction with respect to which the third detection unit 10B indicates the direction of the third applied field. The fourth direction is a reference direction with respect to which the fourth detection unit 20B indicates the direction of the fourth applied field. The definitions of the third and fourth directions and the third and fourth angles are like those of the first and second directions and the first and second angles described with reference to FIG. 4A and FIG. 4B. In the present embodiment, the third direction and the fourth direction are different from each other by 180°. The third direction is, for example, from the center of rotation C to the third detection unit 10B.

In the present embodiment, the angle that the direction of the third partial magnetic field MF3 forms with respect to the third direction is different from the angle that the direction of the first partial magnetic field MF1 forms with respect to the first direction by an angle equivalent to an electrical angle of 90°. Similarly, the angle that the direction of the fourth partial magnetic field MF4 forms with respect to the fourth direction is different from the angle that the direction of the second partial magnetic field MF2 forms with respect to the second direction by an angle equivalent to an electrical angle of 90°.

The first detection unit 10A includes a first detection circuit 11A, a second detection circuit 12A, and a first arithmetic circuit 13A. The first detection circuit 11A, the second detection circuit 12A, and the first arithmetic circuit 13A are the same in configuration as the first detection circuit 11, the second detection circuit 12, and the first arithmetic circuit 13 of the first embodiment, respectively. Each of the first and second detection circuits 11A and 12A detects the intensity of a component of the first applied field in one direction, and outputs a signal indicating the intensity. Based on the output signals of the first and second detection circuits 11A and 12A, the first arithmetic circuit 13A calculates a first detected angle value $\theta 1s$, which is a detected value of the first angle $\theta 1$.

The second detection unit 20A includes a third detection circuit 21A, a fourth detection circuit 22A, and a second arithmetic circuit 23A. The third detection circuit 21A, the fourth detection circuit 22A, and the second arithmetic circuit 23A are the same in configuration as the third detection circuit 21, the fourth detection circuit 22, and the second arithmetic circuit 23 of the first embodiment, respectively. Each of the third and fourth detection circuits 21A and 22A detects the intensity of a component of the second applied field in one direction, and outputs a signal indicating the intensity. Based on the output signals of the third and fourth detection circuits 21A and 22A, the second arithmetic circuit 23A calculates a second detected angle value $\theta 2s$, which is a detected value of the second angle $\theta 2$.

The third detection unit 10B includes a fifth detection circuit 11B, a sixth detection circuit 12B, and a fourth arithmetic circuit 13B. The fifth detection circuit 11B, the sixth detection circuit 12B, and the fourth arithmetic circuit 13B are the same in configuration as the first detection circuit 11, the second detection circuit 12, and the first arithmetic circuit 13 of the first embodiment, respectively. Each of the fifth and sixth detection circuits 11B and 12B detects the intensity of a component of the third applied field in one direction, and outputs a signal indicating the intensity. Based on the output signals of the fifth and sixth detection circuits 11B and 12B, the fourth arithmetic circuit 13B calculates a third detected angle value θ3s, which is a detected value of the third angle θ3.

The fourth detection unit 20B includes a seventh detection circuit 21B, an eighth detection circuit 22B, and a fifth arithmetic circuit 23B. The seventh detection circuit 21B, the eighth detection circuit 22B, and the fifth arithmetic circuit 23B are the same in configuration as the third detection circuit 21, the fourth detection circuit 22, and the second arithmetic circuit 23 of the first embodiment, respectively. Each of the seventh and eighth detection circuits 21B and 22B detects the intensity of a component of the fourth applied field in one direction, and outputs a signal indicating the intensity. Based on the output signals of the seventh and eighth detection circuits 21B and 22B, the fifth arithmetic circuit 23B calculates a fourth detected angle value θ4s, which is a detected value of the fourth angle θ4.

The output signals of the first to eighth detection circuits 11A, 12A, 21A, 22A, 11B, 12B, 21B, and 22B have the same period. In the following description, the period of the output signals of the first to eighth detection circuits 11A, 12A, 21A, 22A, 11B, 12B, 21B, and 22B will be referred to as period T. The output signal of the second detection circuit 12A differs from the output signal of the first detection circuit 11A in phase by an odd number of times ¼ the period T. The output signal of the fourth detection circuit 22A differs from the output signal of the third detection circuit 21A in phase by an odd number of times ¼ the period T. The output signal of the sixth detection circuit 12B differs from the output signal of the fifth detection circuit 11B in phase by an odd number of times ¼ the period T. The output signal of the eighth detection circuit 22B differs from the output signal of the seventh detection circuit 21B in phase by an odd number of times ¼ the period T.

Based on the first detected angle value θ1s obtained by the detection of the first applied field by the first detection unit 10A and the second detected angle value θ2s obtained by the detection of the second applied field by the second detection unit 20A, the third arithmetic circuit 30A calculates a detected value θAs of the angle that the direction of the rotating magnetic field in a first reference position forms with respect to a first reference direction. The detected value θAs is calculated by the same method as with the detected value θs in the first embodiment. Leaving errors aside, the detected value θAs has a difference of constant value (including 0) from the angle that the direction of the rotating magnetic field in a reference position forms with respect to a reference direction. The detected value θAs thus has a correspondence relationship with the angle that the direction of the rotating magnetic field in the reference position forms with the respect to the reference direction.

Based on the third detected angle value θ3s obtained by the detection of the third applied field by the third detection unit 10B and the fourth detected angle value θ4s obtained by the detection of the fourth applied field by the fourth detection unit 20B, the sixth arithmetic circuit 30B calculates a detected value θBs of the angle that the direction of the rotating magnetic field in a second reference position forms with respect to a second reference direction. The detected value θBs is calculated by the same method as with the detected value θs in the first embodiment. Leaving errors aside, the detected value θBs has a difference of constant value (including 0) from the angle that the direction of the rotating magnetic field in the reference position forms with respect to the reference direction. The detected value θBs thus has a correspondence relationship with the angle that the direction of the rotating magnetic field in the reference position forms with the respect to the reference direction.

As shown in FIG. 21, the rotating field sensor 121 further includes a seventh arithmetic circuit 211 that calculates a detected value θs of the angle that the direction of the rotating magnetic field in the reference position forms with the respect to the reference direction, based on the detected value θAs calculated by the third arithmetic circuit 30A and the detected value θs calculated by the sixth arithmetic circuit 30B. The seventh arithmetic circuit 211 can be implemented by a microcomputer, for example. The reference position and the reference direction of the rotating field sensor 121 may coincide with the first reference position and the first reference direction, respectively, or with the second reference position and the second reference direction, respectively, or may be any position and direction different from those positions and directions.

A description will now be given of the configuration of a rotating field sensor 121 of a modification example of the present embodiment. As shown in FIG. 20, the rotating field sensor 121 of the modification example of the present embodiment has a field generation unit 132 instead of the field generation unit 122. The field generation unit 132 has the same configuration as that of the field generation unit 72 of the second embodiment. Specifically, the field generation unit 132 includes a magnet 133 having the same configuration as that of the magnet 73. The magnet 133 makes a straight movement in its longitudinal direction along with a straight movement of the object. As a result, a rotating magnetic field occurs based on the magnetic field generated by the magnet 133. The magnet 133 includes a first layer 133A and a second layer 133B that are the same in configuration as the first layer 73A and the second layer 73B, respectively.

The relative positional relationship of the first and second detection units 10A and 20A with respect to the magnet 133 is the same as that of the first and second detection units 10 and 20 with respect to the magnet 73 in the second embodiment. The relative positional relationship of the third and fourth detection units 10B and 20B with respect to the magnet 133 is also the same as that of the first and second detection units 10 and 20 with respect to the magnet 73 in the second embodiment. In the modification example, the third and fourth detection units 10B and 20B are located in positions offset from the positions of the first and second detection units 10A and 20A, respectively, by an amount equivalent to ¼ the period of the rotation of the rotating magnetic field or an electrical angle of 90°, i.e., as much as a one-fourth pitch of the magnet 133.

Next, a description will be given of the method by which the seventh arithmetic circuit 211 calculates the detected value θs. In the present embodiment, the detected value θAs is calculated based on the first detected angle value θ1s obtained by the detection of the first applied field and the second detected angle value θ2s obtained by the detection of the second applied field. Furthermore, the detected value θBs is calculated based on the third detected angle value θ3s obtained by the detection of the third applied field and the fourth detected angle value θ4s obtained by the detection of the fourth applied field. In the examples shown in FIG. 19 and FIG. 20, the third position and the fourth position are offset from the first position and the second position, respectively, by an amount equivalent to an electrical angle of 90°, and the detected values θAs and θBs differ in phase by an electrical angle of 90°. In such examples, the seventh arithmetic circuit 211 calculates θs by the equation (8) below.

$$\theta s = (\theta As + \theta Bs + \pi/2)/2 \quad (8)$$

The effects of the rotating field sensor 121 will now be described. The rotating field sensor 121 according to the present embodiment is suitable for reducing angular errors resulting from the rotating magnetic field. First, the reason for the occurrence of angular errors due to the rotating magnetic field will be described with reference to FIG. 19, FIG. 20 and FIG. 22. In the example shown in FIG. 19, the first partial magnetic field MF1 includes not-shown components Hr and Hθ. The component Hr is in the radial direction of the magnet 123. The component Hθ is in the direction orthogonal to Hr within a plane perpendicular to the center of rotation C. In the example shown in FIG. 20, the first partial magnetic field MF1 includes not-shown components Hr and Hθ. The component Hr is in the direction orthogonal to the direction of movement of the magnet 133 within a virtual plane perpendicular to the direction of arrangement of the first detection unit 10A and the second detection unit 20A. The component Hθ is in the direction orthogonal to Hr within the foregoing plane.

Figure 22:
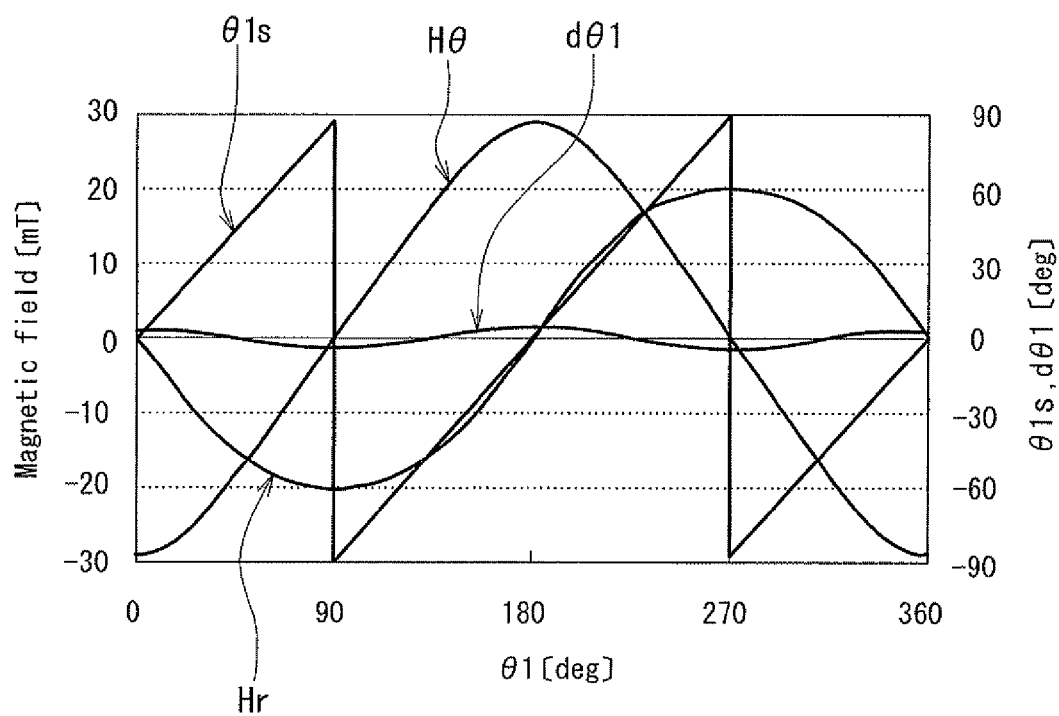
FIG. 22 is a waveform chart showing the relationship between a first partial magnetic field, a first detected angle value, and a first angular error in the fifth embodiment of the invention.

Suppose, in the example shown in FIG. 19 or FIG. 20, that the first applied field consists only of the first partial magnetic field MF1, and the first detection unit 10A detects the direction of the first applied filed to obtain the first detected angle value θ1. FIG. 22 shows an example of the relationship between Hr, Hθ, θ1s, and a first angular error in this case. In the present embodiment, the first angular error will be denoted by symbol dθ1. In FIG. 22, the horizontal axis indicates the angle θ1, and the vertical axis indicates Hr, Hθ, θ1s, and dθ1. For ease of understanding, FIG. 22 shows the waveform of the first angular error dθ1 with exaggerated amplitude. In the example shown in FIG. 19 or FIG. 20, the direction of the first partial magnetic field MF1 and the intensity of the component of the first partial magnetic field MF1 in one direction sometimes fail to make a sinusoidal change. In such a case, the first detected angle value θ1s includes the first angular error dθ1 with respect to a theoretical value of the first angle θ1 that is expected when the first applied field consists only of the first partial magnetic field MF1 and the direction of the first partial magnetic field MF1 makes an ideal rotation. The first angular error dθ1 in this case changes depending on a change of the direction of the first partial magnetic field MF1. The first angular error dθ1 has an error period of ½ the period of the rotation of the direction of the first partial magnetic field MF1.

Likewise, when the second detected angle value θ2s is obtained by the detection of the direction of the second applied field by the second detection unit 20A, the second detected angle value θ2s includes a second angular error with respect to a theoretical value of the second angle θ2 that is expected when the second applied field consists only of the second partial magnetic field MF2 and the direction of the second partial magnetic field MF2 makes an ideal rotation. In the present embodiment, the second angular error will be denoted by symbol dθ2. The second angular error dθ2 in this case changes depending on a change of the direction of the second partial magnetic field MF2. The second angular error dθ2 has an error period of ½ the period of the rotation of the direction of the second partial magnetic field MF2.

Likewise, when the third detected angle value θ3s is obtained by the detection of the direction of the third applied field by the third detection unit 10B, the third detected angle value θ3s includes a third angular error with respect to a theoretical value of the third angle θ3 that is expected when the third applied field consists only of the third partial magnetic field MF3 and the direction of the third partial magnetic field MF3 makes an ideal rotation. In the present embodiment, the third angular error will be denoted by symbol dθ3. The third angular error dθ3 in this case changes depending on a change of the direction of the third partial magnetic field MF3. The third angular error dθ3 has an error period of ½ the period of the rotation of the direction of the third partial magnetic field MF3.

Likewise, when the fourth detected angle value θ4s is obtained by the detection of the direction of the fourth applied field by the fourth detection unit 20B, the fourth detected angle value θ4s includes a fourth angular error with respect to a theoretical value of the fourth angle θ4 that is expected when the fourth applied field consists only of the fourth partial magnetic field MF4 and the direction of the fourth partial magnetic field MF4 makes an ideal rotation. In the present embodiment, the fourth angular error will be denoted by symbol dθ4. The fourth angular error dθ4 in this case changes depending on a change of the direction of the fourth partial magnetic field MF4. The fourth angular error dθ4 has an error period of ½ the period of the rotation of the direction of the fourth partial magnetic field MF4.

As described previously, the first partial magnetic field MF1 and the second partial magnetic field MF2 differ in direction by 180° and rotate in the same direction of rotation. The third partial magnetic field MF3 and the fourth partial magnetic field MF4 differ in direction by 180° and rotate in the same direction of rotation as that of the first and second partial magnetic fields MF1 and MF2. Accordingly, the directions of the first to fourth partial magnetic fields MF1, MF2, MF3, and MF4 have the same period of rotation, and the first to fourth angular errors dθ1, dθ2, dθ3, and dθ4 make periodic changes with the same error period in response to changes of the directions of the first to fourth partial magnetic fields MF1, MF2, MF3, and MF4.

Figure 23:
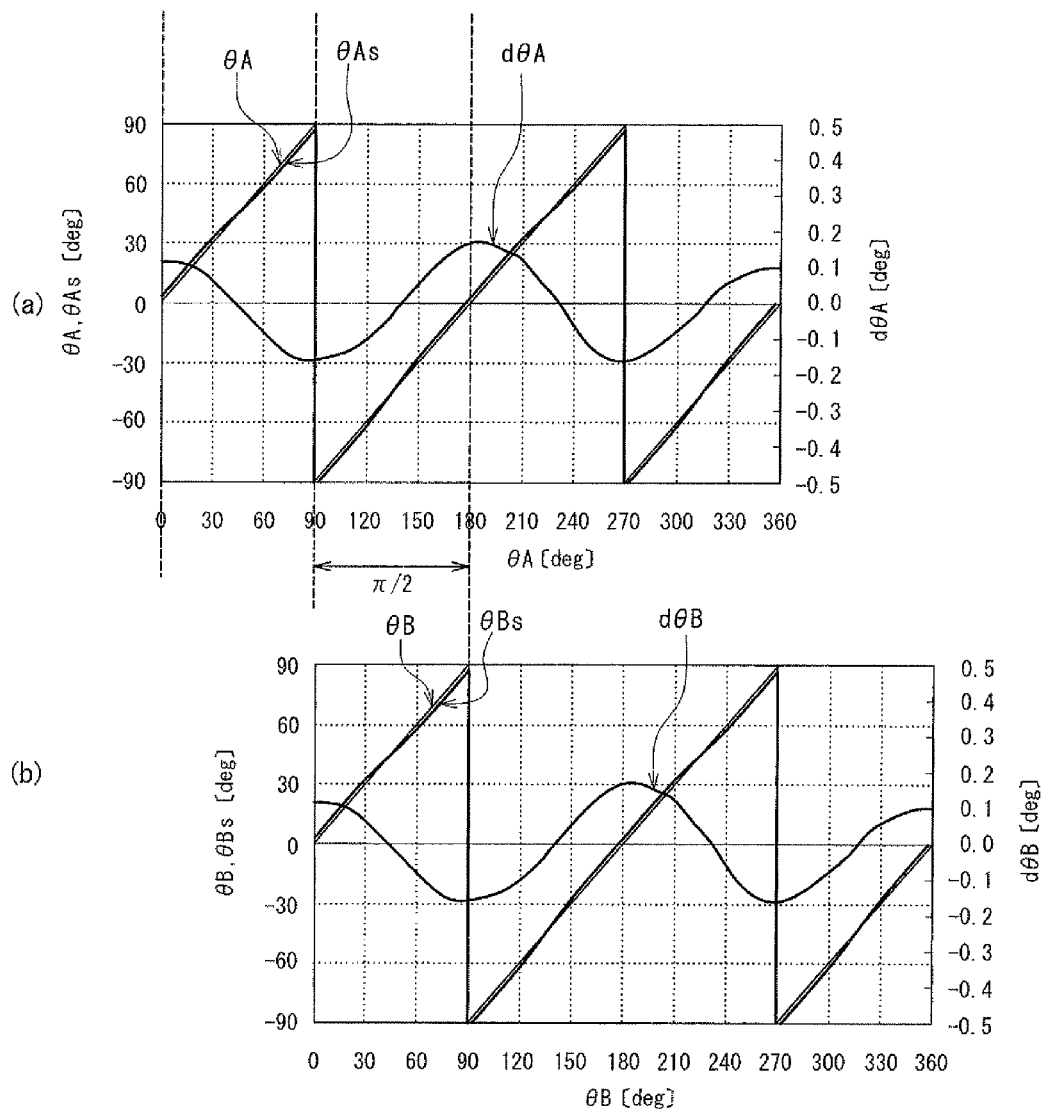
FIG. 23 is an explanatory diagram showing the operation of reducing an angular error in the fifth embodiment of the invention.

Next, with reference to FIG. 23 and FIG. 24, a description will be given of how the rotating field sensor 121 can be used to reduce the angular errors resulting from the rotating magnetic field. Portion (a) of FIG. 23 shows the relationship between the detected value θAs and an angular error MA included in the detected value θAs. Portion (b) of FIG. 23 shows the relationship between the detected value θBs and an angular error dθB included in the detected value θBs. In FIG. 23, symbol θA represents the angle that the direction of the rotating magnetic field in the first reference position forms with respect to the first reference direction, and symbol θB represents the angle that the direction of the rotating magnetic field in the second reference position forms with respect to the second reference direction. As mentioned previously, the detected values θAs and θBs are calculated by the same method as with the detected value θs in the first embodiment. For example, as described in relation to the first embodiment, when the first direction D1 and the second direction D2 are different from each other by 180° and the third direction D3 and the fourth direction D4 are also different from each other by 180°, both the detected values θAs and θBs are calculated by the equation (1) given in the first embodiment. As can be seen from the equation (1), the detected value θAs has a correspondence relationship with both the first detected angle value θ1s and the second detected angle value θ2s. Accordingly, the angular error dθA included in the detected value θAs has a correspondence relationship with both the first angular error dθ1 included in the first detected angle value θ1s and the second angular error dθ2 included in the second detected angle value θ2s. The phases of the angular errors dθ1, dθ2, and dθA are equal to each other. Likewise, since the detected value θBs has a correspondence relationship with both the third detected angle value θ3s and the fourth detected angle value θ4s, the angular error dθB included in the detected value θBs has a correspondence relationship with both the third angular error dθ3 included in the third detected angle value θ3s and the fourth angular error dθ4 included in the fourth detected angle value θ4s. The phases of the angular errors dθ3, dθ4, and dθB are equal to each other.

In the example shown in FIG. 23, the angular errors dθA and dθB have an amplitude of ±0.17°. In the present embodiment, the third position and the fourth position are offset from the first position and the second position, respectively, by an amount equivalent to ½ the error period (an electrical angle of 90°), and the detected values θAs and θBs differ in phase by ½ the error period (an electrical angle of 90°). Therefore, when calculating the detected value θs, the angular error dθA and the angular error dθB are in opposite phases. Consequently, the angular error dθA and the angular error dθB cancel each other out.

Figure 24:
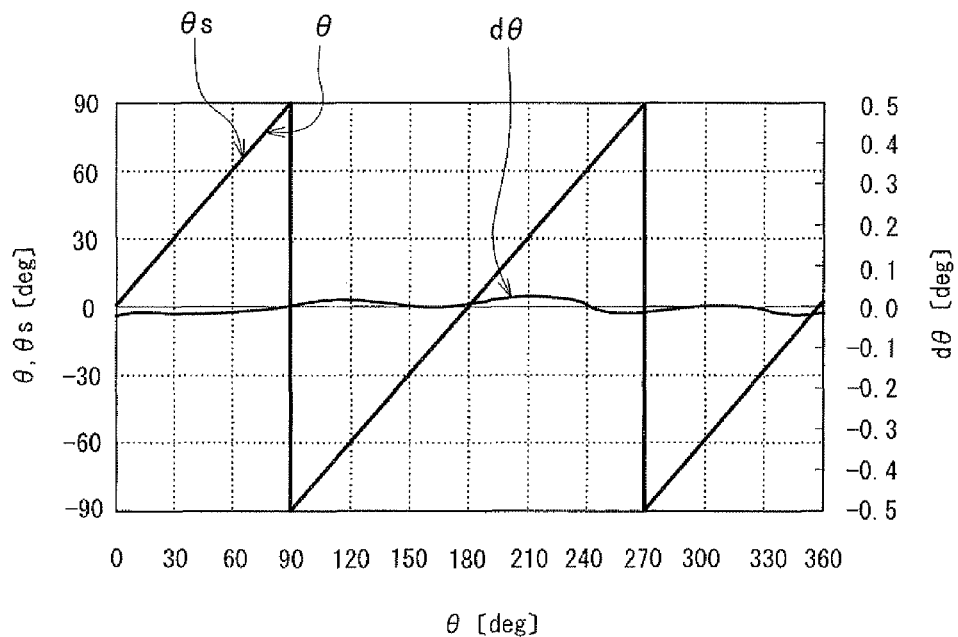
FIG. 24 is a waveform chart showing the relationship between a detected angle value and an angular error in the fifth embodiment of the invention.

FIG. 24 shows the relationship between the detected value θs calculated as described above and an angular error included in the detected value θs. In FIG. 24, symbol θ represents the angle that the direction of the rotating magnetic field in the reference position forms with respect to the reference direction, and symbol dθ represents the angular error included in the detected value θs. As shown in FIG. 24, the angular error dθ is significantly smaller than the angular errors dθA and dθB. In the example shown in FIG. 24, the angular error dθ has an amplitude of ±0.03°.

In the present embodiment, the third position and the fourth position are offset from the first position and the second position, respectively, by an amount equivalent to ½ the error period. However, the third position and the fourth position may be offset from the first position and the second position by an amount equivalent to an odd number of times ½ the error period. In such a case, the angular error dθA and the angular error dθB cancel each other out to significantly reduce the angular error dθ that is included in the detected value θs.

In the present embodiment, the phase difference between the detected values θAs and θBs is not limited to 90° in electrical angle, and may be of any value. Assuming that the phase difference between the detected values θAs and θBs is β, the seventh arithmetic circuit 211 calculates θs by the equation (9) below.

$$\theta s=(\theta As+\theta Bs+\beta)/2 \quad (9)$$

According to the present embodiment, even if a noise field $H_{ext}$ other than the rotating magnetic field is applied to the rotating field sensor 121 from outside, it is possible to reduce the errors in the detected values θAs and θBs resulting from the noise field $H_{ext}$. This will be discussed in detail below. When the noise field $H_{ext}$ is applied, the first applied field is a composite magnetic field resulting from the combination of the first partial magnetic field MF1 and the noise field $H_{ext}$, and the second applied field is a composite magnetic field resulting from the combination of the second partial magnetic field MF2 and the noise field $H_{ext}$. As mentioned previously, the third arithmetic circuit 30A calculates the detected value θAs by the same method as with the detected value θs in the first embodiment. Accordingly, as described in relation to the first embodiment, the first noise error in the first detected angle value θ1s resulting from the noise field $H_{ext}$ and the second noise error in the second detected angle value θ2s resulting from the noise field $H_{ext}$ have values of opposite sign. Consequently, for the same reason as in the description of the first embodiment, it is possible according to the present embodiment to reduce the error in the detected value θAs resulting from the noise field $H_{ext}$.

Likewise, when the noise field $H_{ext}$ is applied, the third applied field is a composite magnetic field resulting from the combination of the third partial magnetic field MF3 and the noise field $H_{ext}$, and the fourth applied field is a composite magnetic field resulting from the combination of the fourth partial magnetic field MF4 and the noise field $H_{ext}$. In this case, like the first and second noise errors, a third noise error occurs in the third detected angle value θ3s and a fourth noise error occurs in the fourth detected angle value θ4s, due to the noise field $H_{ext}$. As mentioned previously, the sixth arithmetic circuit 30B calculates the detected value θBs by the same method as with the detected value θs in the first embodiment. Accordingly, the third noise error and the fourth noise error have values of opposite sign. Consequently, for the same reason as in the description of the first embodiment, it is possible according to the present embodiment to reduce the error in the detected value θBs resulting from the noise field $H_{ext}$.

The other configuration, operation, and effects of the present embodiment are the same as those of the first embodiment.

Sixth Embodiment

A rotating field sensor according to a sixth embodiment of the invention will now be described. The rotating field sensor 141 according to the present embodiment is capable of reducing both an angular error component that results from the rotating magnetic field and an angular error component that results from the MR elements.

Figure 25:
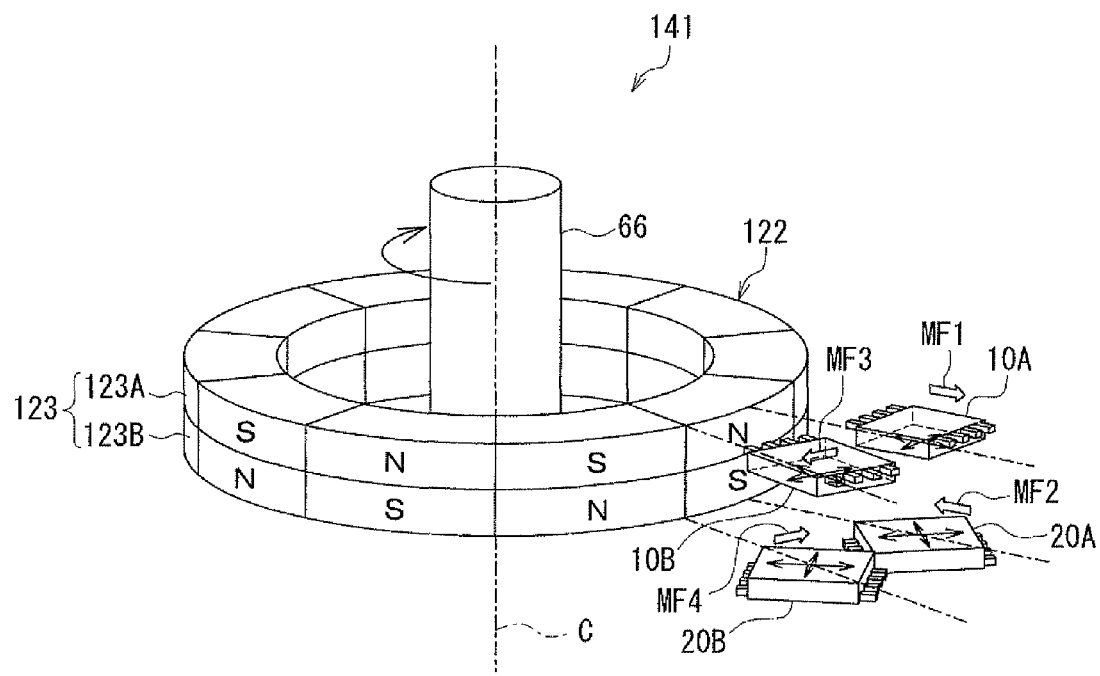
FIG. 25 is a perspective view showing the general configuration of a rotating field sensor according to a sixth embodiment of the invention.

With reference to FIG. 25, the configuration of the rotating field sensor 141 according to the present embodiment will be described first. FIG. 25 is a perspective view showing the general configuration of the rotating field sensor 141 according to the present embodiment. The configuration of the rotating field sensor 141 is basically the same as that of the rotating field sensor 121 according to the fifth embodiment shown in FIG. 19. In the present embodiment, the first direction D1 or the reference direction with respect to which the first detection unit 10A indicates the direction of the first applied field and the second direction D2 or the reference direction with respect to which the second detection unit 20A indicates the direction of the second applied field are different from each other by an odd number of times 45° in the rotational direction of the first and second partial magnetic fields MF1 and MF2. Likewise, the third direction D3 or the reference direction with respect to which the third detection unit 10B indicates the direction of the third applied field and the fourth direction D4 or the reference direction with respect to which the fourth detection unit 20B indicates the direction of the fourth applied field are different from each other by an odd number of times 45° in the rotational direction of the third and fourth partial magnetic fields MF3 and MF4. To achieve such differences, in the example shown in FIG. 25, the second and fourth detection units 20A and 20B are arranged in an orientation different from that shown in FIG. 19. In the example shown in FIG. 25, the second and fourth detection units 20A and 20B are each situated in an orientation 45° rotated from the state shown in FIG. 19 within a virtual plane perpendicular to the center of rotation C. Here, the second and fourth detection units 20A and 20B are rotated about an axis that passes the centers of the detection units 20A and 20B and is parallel to the center of rotation C. The first and third detection units 10A and 10B are in the same orientation as in FIG. 19.

Figure 26:
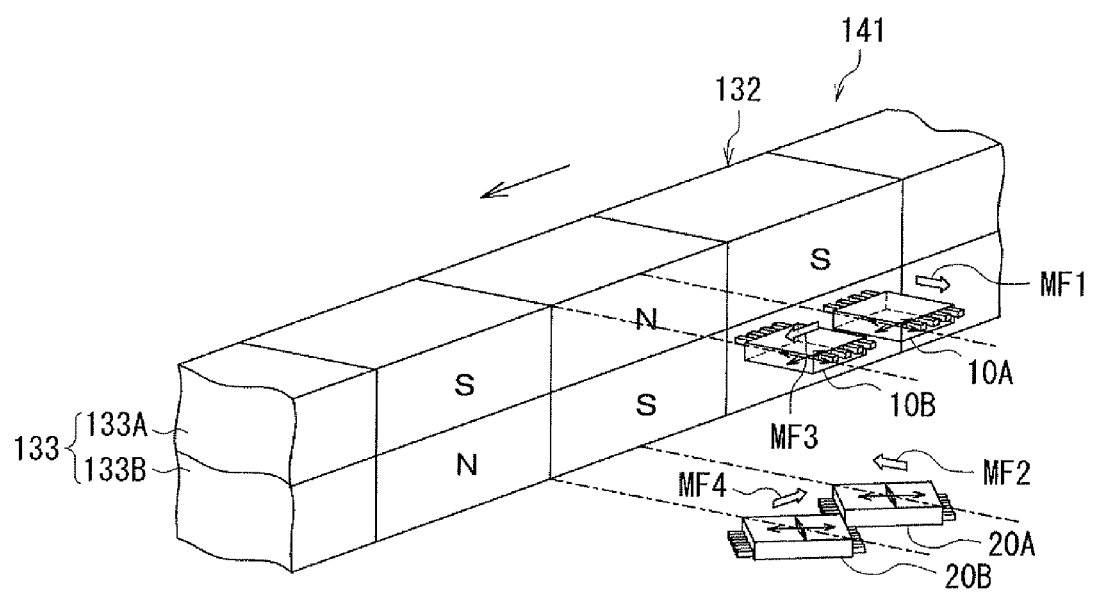
FIG. 26 is a perspective view showing the general configuration of a rotating field sensor of a modification example of the sixth embodiment of the invention.

Reference is now made to FIG. 26 to describe the configuration of a rotating field sensor 141 of a modification example of the present embodiment. FIG. 26 is a perspective view showing the general configuration of the rotating field sensor 141 of the modification example of the present embodiment. The configuration of the rotating field sensor 141 of the modification example is basically the same as that of the rotating field sensor 121 of the modification example of the fifth embodiment shown in FIG. 20. In this modification example, the second and fourth detection units 20A and 20B have a different orientation from that shown in FIG. 20. Specifically, the detection units 20A and 20B are situated in an orientation 45° rotated from the state shown in FIG. 20 within a virtual plane on which the detection units 20A and 20B are arranged, about an axis that passes the centers of the detection units 20A and 20B and is perpendicular to the foregoing virtual plane. The first and third detection units 10A and 10B are in the same orientation as in FIG. 20. It should be appreciated that instead of arranging the detection units 20A and 20B in the foregoing orientation, the directions of magnetization of the magnetization pinned layers in the MR elements that are included in the detection units 20A and 20B may be rotated by 45° with respect to those of the fifth embodiment. Otherwise, the detection units 10A and 10B may be situated in an orientation −45° rotated from the state shown in FIG. 20 within a virtual plane on which the detection units 10A and 10B are arranged, about an axis that passes the centers of the detection units 10A and 10B and is perpendicular to the virtual plane. Alternatively, the directions of magnetization of the magnetization pinned layers in the MR elements that are included in the detection units 10A and 10B may be rotated by −45° with respect to those of the fifth embodiment.

In the examples shown in FIG. 25 and FIG. 26, the first direction D1 or the reference direction with respect to which the first detection unit 10A indicates the direction of the first applied field and the second direction D2 or the reference direction with respect to which the second detection unit 20A indicates the direction of the second applied field are different from each other by an odd number of times 45° in the rotational direction of the first and second partial magnetic fields MF1 and MF2. Accordingly, as described in relation to the fourth embodiment, the first detected angle value θ1s or the detected value of the first angle θ1 that the direction of the first applied field forms with respect to the first direction D1 is different in phase from the second detected angle value θ2s or the detected value of the second angle θ2 that the direction of the second applied field forms with respect to the second direction D2 by an odd number of times π/4 (an electrical angle of) 45°).

Likewise, the third direction D3 or the reference direction with respect to which the third detection unit 10B indicates the direction of the third applied field and the fourth direction D4 or the reference direction with respect to which the fourth detection unit 20B indicates the direction of the fourth applied field are different from each other by an odd number of times 45° in the rotational direction of the third and fourth partial magnetic fields MF3 and MF4. Accordingly, as described in relation to the fourth embodiment, the third detected angle value θ3s or the detected value of the third angle θ3 that the direction of the third applied field forms with respect to the third direction D3 is different in phase from the fourth detected angle value θ4s or the detected value of the fourth angle θ4 that the direction of the fourth applied field forms with respect to the fourth direction D4 by an odd number of times π/4 (an electrical angle of 45°).

In the examples shown in FIG. 25 and FIG. 26, as with the fifth embodiment, the third position and the fourth position are offset from the first position and the second position, respectively, by an amount equivalent to an electrical angle of 90°, and the detected values θAs and θBs differ in phase by an electrical angle of 90°.

Now, a description will be given of the method of the present embodiment for calculating the detected value θs of the angle that the direction of the rotating magnetic field in the reference position forms with respect to the reference direction. The first composite detection unit 210A of the present embodiment calculates the detected value θAs based on the first detected angle value θ1s obtained by the first detection unit 10A and the second detected angle value θ2s obtained by the second detection unit 20A. The second composite detection unit 210B of the present embodiment calculates the detected value θBs based on the third detected angle value θ3s obtained by the third detection unit 10B and the fourth detected angle value θ4s obtained by the fourth detection unit 20B. The detected values θAs and θBs are calculated by the same method as with the detected value θs in the fourth embodiment.

The seventh arithmetic circuit 211 of the present embodiment calculates the detected value θs based on the detected values θAs and θBs obtained by the composite detection units 210A and 210B. The seventh arithmetic circuit 211 calculates the detected value θs in the same way as in the fifth embodiment.

The effects of the rotating field sensor 141 will now be described. First, it will be described that the angular error sometimes includes both an angular error component resulting from the rotating magnetic field and an angular error component resulting from the MR elements. In the examples shown in FIG. 25 and FIG. 26, as described in relation to the fifth embodiment, each of the first to fourth detected angle values θ1s, θ2s, θ3s, and θ4s can include an angular error component resulting from the rotating magnetic field. As described in relation to the fourth embodiment, each of the first to fourth detected angle values θ1s, θ2s, θ3s, and θ4s can also include an angular error component resulting from the MR elements.

Accordingly, the first angular error dθ1 in the first detected angle value θ1s, the second angular error dθ2 in the second detected angle value θ2s, the third angular error dθ3 in the third detected angle value θ3s, and the fourth angular error dθ4 in the fourth detected angle value θ4s can each include a first error component that results from the rotating magnetic field and a second error component that results from the MR elements. The first error component changes depending on a change of the direction of the rotating magnetic field, with a first error period which is ½ the period of the rotation of the direction of the rotating magnetic field, i.e., an electrical angle of 180°. The second error component changes with a second error period which is ¼ the period of the output signals of the first to eighth detection circuits 11A, 12A, 21A, 22A, 11B, 12B, 21B, and 22B (see FIG. 21), i.e., an electrical angle of 90°.

In the present embodiment, the first detected angle value θ1s and the second detected angle value θ2s are given a difference in phase by an odd number of times ½ the second error period (an electrical angle of 45°). Furthermore, the third detected angle value θ3s and the fourth detected angle value θ4s are given a difference in phase by an odd number of times ½ the second error period (an electrical angle of 45°). In the present embodiment, the detected values θAs and θBs are calculated by the same method as with the detected value θs in the fourth embodiment. Consequently, according to the present embodiment, the second error component of the first angular error dθ1 and the second error component of the second angular error dθ2 cancel each other out when calculating the detected value θAs. Likewise, the second error component of the third angular error dθ3 and the second error component of the fourth angular error dθ4 cancel each other out when calculating the detected value θBs.

As mentioned above, the detected values θAs and θBs are calculated by the same method as with the detected value θs in the fourth embodiment. This makes it possible that, even when a noise field $H_{ext}$ other than the rotating magnetic field is applied to the rotating field sensor 141 from outside, the errors in the detected values θAs and θBs resulting from the noise field $H_{ext}$ are reduced when calculating the detected values θAs and θBs.

Furthermore, in the present embodiment, the third position and the fourth position are offset from the first position and the second position, respectively, by an amount equivalent to ½ the first error period (an electrical angle of 90°). In the present embodiment, the detected value θs is calculated by the same method as in the fifth embodiment. Consequently, according to the present embodiment, the first error components of the first and second angular errors dθ1 and dθ2 included in the detected value θAs and the first error components of the third and fourth angular errors dθ3 and dθ4 included in the detected value θBs cancel each other out when calculating the detected value θs. It should be noted that in the present embodiment, the third position and the fourth position may be offset from the first position and the second position by an amount equivalent to an odd number of times ½ the first error period, as in the fifth embodiment.

The other configuration, operation, and effects of the present embodiment are the same as those of the fourth or fifth embodiment.

The present invention is not limited to the foregoing embodiments, and various modifications may be made thereto. For example, the arrangement of the plurality of detection units in the foregoing embodiments are illustrative only. Various modifications may be made to the arrangement of the plurality of detection units within the scope of the requirements set forth in the claims.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A rotating field sensor for detecting an angle that a direction of a rotating magnetic field in a reference position forms with respect to a reference direction, the rotating field sensor comprising:
   a field generation unit that generates the rotating magnetic field, the rotating magnetic field including a first partial magnetic field in a first position and a second partial magnetic field in a second position, the first partial magnetic field and the second partial magnetic field differing in direction by 180° and rotating in the same direction of rotation;
   a first detection unit for detecting, in the first position, a first angle that a direction of a first applied field forms with respect to a first direction, the first applied field including the first partial magnetic field as its main component; and
   a second detection unit for detecting, in the second position, a second angle that a direction of a second applied field forms with respect to a second direction, the second applied field including the second partial magnetic field as its main component, wherein:
   the first detection unit has: a first detection circuit and a second detection circuit each of which includes at least one magnetic detection element, detects an intensity of a component of the first applied field in one direction and outputs a signal indicating the intensity; and a first arithmetic circuit that calculates a first detected angle value which is a detected value of the first angle, based on the output signals of the first and second detection circuits;
   the second detection unit has: a third detection circuit and a fourth detection circuit each of which includes at least one magnetic detection element, detects an intensity of a component of the second applied field in one direction and outputs a signal indicating the intensity; and a second arithmetic circuit that calculates a second detected angle value which is a detected value of the second angle, based on the output signals of the third and fourth detection circuits;
   the output signals of the first to fourth detection circuits have the same period;
   the output signal of the second detection circuit differs from the output signal of the first detection circuit in phase by an odd number of times ¼ the period; and
   the output signal of the fourth detection circuit differs from the output signal of the third detection circuit in phase by an odd number of times ¼ the period,
   the rotating field sensor further comprising a third arithmetic circuit that calculates, based on the first detected angle value and the second detected angle value, a detected value having a correspondence relationship with the angle that the direction of the rotating magnetic field in the reference position forms with respect to the reference direction.

2. The rotating field sensor according to claim 1, wherein:
   a noise field other than the rotating magnetic field is applied to the rotating field sensor;
   the first applied field is a composite magnetic field resulting from a combination of the first partial magnetic field and the noise field; and
   the second applied field is a composite magnetic field resulting from a combination of the second partial magnetic field and the noise field.

3. The rotating field sensor according to claim 1, wherein the first direction and the second direction are different from each other by 180°.

4. The rotating field sensor according to claim 1, wherein each of the first to fourth detection circuits includes, as the at least one magnetic detection element, a pair of magnetic detection elements connected in series.

5. The rotating field sensor according to claim 4, wherein each of the first to fourth detection circuits has a Wheatstone bridge circuit that includes a first pair of magnetic detection elements connected in series and a second pair of magnetic detection elements connected in series.

6. The rotating field sensor according to claim 4, wherein the magnetic detection elements are magnetoresistive elements.

7. The rotating field sensor according to claim 6, wherein each of the magnetoresistive elements has a magnetization pinned layer whose direction of magnetization is pinned, a free layer whose direction of magnetization varies according to the direction of a magnetic field applied thereto, and a nonmagnetic layer disposed between the magnetization pinned layer and the free layer.

8. The rotating field sensor according to claim 7, wherein:
   the directions of magnetization of the magnetization pinned layers of the magnetoresistive elements in the second detection circuit are orthogonal to those of the magnetization pinned layers of the magnetoresistive elements in the first detection circuit; and the directions of magnetization of the magnetization pinned layers of the magnetoresistive elements in the fourth detection circuit are orthogonal to those of the magnetization pinned layers of the magnetoresistive elements in the third detection circuit.

9. The rotating field sensor according to claim 1, wherein:

the first detected angle value includes a first angular error with respect to a theoretical value of the first angle that is expected when the first applied field consists only of the first partial magnetic field and the direction of the first partial magnetic field makes an ideal rotation;

the second detected angle value includes a second angular error with respect to a theoretical value of the second angle that is expected when the second applied field consists only of the second partial magnetic field and the direction of the second partial magnetic field makes an ideal rotation;

the first angular error and the second angular error make periodic changes with the same error period in response to changes of the directions of the first and second partial magnetic fields, the change of the first angular error depending on a change of the first detected angle value, the change of the second angular error depending on a change of the second detected angle value; and the first detected angle value and the second detected angle value differ in phase by an odd number of times ½ the error period.

10. The rotating field sensor according to claim 9, wherein the first direction and the second direction differ by an odd number of times ½ the error period in the direction of rotation of the first and second partial magnetic fields.

11. The rotating field sensor according to claim 9, wherein the error period is ¼ the period of the output signals of the detection circuits.

12. The rotating field sensor according to claim 1, wherein the rotating magnetic field further includes a third partial magnetic field in a third position and a fourth partial magnetic field in a fourth position, the third partial magnetic field and the fourth partial magnetic field differing in direction by 180° and rotating in the same direction of rotation as the direction of rotation of the first and second partial magnetic fields, the rotating field sensor further comprising:

a third detection unit for detecting, in the third position, a third angle that a direction of a third applied field forms with respect to a third direction, the third applied field including the third partial magnetic field as its main component; and a fourth detection unit for detecting, in the fourth position, a fourth angle that a direction of a fourth applied field forms with respect to a fourth direction, the fourth applied field including the fourth partial magnetic field as its main component, wherein:

the third detection unit has: a fifth detection circuit and a sixth detection circuit each of which includes at least one magnetic detection element, detects an intensity of a component of the third applied field in one direction and outputs a signal indicating the intensity; and a fourth arithmetic circuit that calculates a third detected angle value which is a detected value of the third angle, based on the output signals of the fifth and sixth detection circuits;

the fourth detection unit has: a seventh detection circuit and an eighth detection circuit each of which includes at least one magnetic detection element, detects an intensity of a component of the fourth applied field in one direction and outputs a signal indicating the intensity; and a fifth arithmetic circuit that calculates a fourth detected angle value which is a detected value of the fourth angle, based on the output signals of the seventh and eighth detection circuits;

the output signals of the first to eighth detection circuits have the same period;

the output signal of the sixth detection circuit differs from the output signal of the fifth detection circuit in phase by an odd number of times ¼ the period; and the output signal of the eighth detection circuit differs from the output signal of the seventh detection circuit in phase by an odd number of times ¼ the period, the rotating field sensor further comprising:

a sixth arithmetic circuit that calculates, based on the third detected angle value and the fourth detected angle value, a detected value having a correspondence relationship with the angle that the direction of the rotating magnetic field in the reference position forms with respect to the reference direction; and a seventh arithmetic circuit that calculates a detected value of the angle that the direction of the rotating magnetic field in the reference position forms with respect to the reference direction, based on the detected value calculated by the third arithmetic circuit and the detected value calculated by the sixth arithmetic circuit.

13. The rotating field sensor according to claim 12, wherein:

a noise field other than the rotating magnetic field is applied to the rotating field sensor from outside;

the first applied field is a composite magnetic field resulting from a combination of the first partial magnetic field and the noise field;

the second applied field is a composite magnetic field resulting from a combination of the second partial magnetic field and the noise field;

the third applied field is a composite magnetic field resulting from a combination of the third partial magnetic field and the noise field; and the fourth applied field is a composite magnetic field resulting from a combination of the fourth partial magnetic field and the noise field.

14. The rotating field sensor according to claim 12, wherein the first direction and the second direction are different from each other by 180°, and the third direction and the fourth direction are different from each other by 180°.

15. The rotating field sensor according to claim 12, wherein:

the first detected angle value includes a first angular error with respect to a theoretical value of the first angle that is expected when the first applied field consists only of the first partial magnetic field and the direction of the first partial magnetic field makes an ideal rotation;

the second detected angle value includes a second angular error with respect to a theoretical value of the second angle that is expected when the second applied field consists only of the second partial magnetic field and the direction of the second partial magnetic field makes an ideal rotation;

the third detected angle value includes a third angular error with respect to a theoretical value of the third angle that is expected when the third applied field consists only of the third partial magnetic field and the direction of the third partial magnetic field makes an ideal rotation;

the fourth detected angle value includes a fourth angular error with respect to a theoretical value of the fourth angle that is expected when the fourth applied field consists only of the fourth partial magnetic field and the direction of the fourth partial magnetic field makes an ideal rotation;

the first to fourth angular errors make periodic changes with the same error period in response to changes of the directions of the first to fourth partial magnetic fields, the changes of the first to fourth angular errors depending on the changes of the directions of the first to fourth partial magnetic fields, respectively; and the third position and the fourth position are offset from the first position and the second position, respectively, by an amount equivalent to an odd number of times ½ the error period.

16. The rotating field sensor according to claim 15, wherein the error period is ½ the period of the rotation of the direction of the rotating magnetic field.

17. The rotating field sensor according to claim 15, wherein:

the first angular error includes a component that changes with the error period depending on the change of the direction of the first partial magnetic field, and a component that changes with a second error period depending on a change of the first detected angle value;

the second angular error includes a component that changes with the error period depending on the change of the direction of the second partial magnetic field, and a component that changes with the second error period depending on a change of the second detected angle value;

the third angular error includes a component that changes with the error period depending on the change of the direction of the third partial magnetic field, and a component that changes with the second error period depending on a change of the third detected angle value;

the fourth angular error includes a component that changes with the error period depending on the change of the direction of the fourth partial magnetic field, and a component that changes with the second error period depending on a change of the fourth detected angle value;

the first detected angle value and the second detected angle value differ in phase by an odd number of times ½ the second error period; and the third detected angle value and the fourth detected angle value differ in phase by an odd number of times ½ the second error period.

* * * * *